(12) United States Patent
Otaka et al.

(10) Patent No.: US 8,060,038 B2
(45) Date of Patent: Nov. 15, 2011

(54) RADIO TRANSMITTER USING CARTESIAN LOOP

(75) Inventors: Shoji Otaka, Yokohama (JP); Yuta Araki, Tokyo (JP); Toru Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 742 days.

(21) Appl. No.: 12/188,022

(22) Filed: Aug. 7, 2008

(65) Prior Publication Data

US 2009/0042521 A1 Feb. 12, 2009

(30) Foreign Application Priority Data

Aug. 9, 2007 (JP) ................................. 2007-208091

(51) Int. Cl.
*H04B 1/04* (2006.01)
*H04B 1/02* (2006.01)
(52) U.S. Cl. ......................... 455/126; 455/91; 455/127.1
(58) Field of Classification Search ................... 455/91, 455/126, 115.1, 127.1, 127.2, 127.3; 330/51, 330/110, 109, 85, 86
See application file for complete search history.

(56) References Cited

U.S. PATENT DOCUMENTS

| | | | | |
|---|---|---|---|---|
| 5,134,718 A | * | 7/1992 | Gailus | 455/102 |
| 5,945,876 A | * | 8/1999 | Jones | 330/51 |
| 6,381,286 B1 | * | 4/2002 | Wilkinson et al. | 375/296 |
| 6,384,677 B2 | * | 5/2002 | Yamamoto | 330/10 |
| 6,606,483 B1 | * | 8/2003 | Baker et al. | 455/126 |
| 7,164,313 B2 | * | 1/2007 | Capofreddi et al. | 330/86 |
| 7,277,034 B2 | * | 10/2007 | Tassin et al. | 341/139 |
| 7,324,193 B2 | | 1/2008 | Lally et al. | 356/237.2 |
| 7,340,226 B2 | * | 3/2008 | Ben-Ayun et al. | 455/126 |
| 7,502,599 B2 | * | 3/2009 | Ben-Ayun et al. | 455/126 |
| 2004/0166813 A1 | * | 8/2004 | Mann et al. | 455/69 |
| 2008/0048795 A1 | | 2/2008 | Hoshino et al. | 331/183 |
| 2011/0116558 A1 | * | 5/2011 | Otaka et al. | 375/259 |

FOREIGN PATENT DOCUMENTS

| JP | 10-136048 | 5/1998 |
|---|---|---|
| JP | 2002299965 (A) | 10/2002 |
| JP | 2003198390 (A) | 7/2003 |

OTHER PUBLICATIONS

Official Action dated Aug. 25, 2009 for corresponding Japanese Patent Application No. 2007-208091(with English translation).
U.S. Appl. No. 12/025,314, filed Feb. 4, 2008, Yuta Araki.
Dogan, et al., "A Dc-10GHz Linear-in-dB Attenuator in 0.13um CMOS Technology", IEEE 2004 Custom Integrated Circuits Conference, pp. 609-612, Oct. 2004.

\* cited by examiner

*Primary Examiner* — Sonny Trinh
(74) *Attorney, Agent, or Firm* — Ohlandt, Greeley, Ruggiero & Perle, L.L.P.

(57) ABSTRACT

A radio transmitter including a combiner which combines input I/Q signals with feedback I/Q signals, a power amplifier which amplifies the quadrature modulated signal, a detector which detects amplitude and phase differences between the input and feedback I/Q signals, a switch to turn on and off the feedback I/Q signals, a generator to generate control signals which minimizes the amplitude difference and the phase difference, in a state where a transmission power is set, during for a period during which the switch is turned off, an amplitude adjuster which adjusts an amplitude of the feedback RF signal, during a period during which the switch is turned on, and a phase adjuster which adjusts a phase of the local signal, during the period during which the switch is turned on.

21 Claims, 14 Drawing Sheets

RADIO TRANSMITTER USING CARTESIAN LOOP

CROSS-REFERENCE TO RELATED APPLICATIONS

This application is based upon and claims the benefit of priority from prior Japanese Patent Application No. 2007-208091, filed Aug. 9, 2007, the entire contents of which are incorporated herein by reference.

BACKGROUND OF THE INVENTION

1. Field of the Invention

The present invention relates to a radio transmitter using a Cartesian loop.

2. Description of the Related Art

In radio transmitters such as mobile terminals, a transmit RF signal is amplified by a power amplifier, to radiate the transmit RF signal from an antenna on the transmission side. The power amplifier is required to maintain linearity such that the transmit RF signal falls within a spectrum mask determined by the standard of the radio system. The power amplifier is also required to reduce the odd-order distortions. This is because the adjacent channel leakage power, which is one of the parameters specified by the standard of the radio system, is mainly caused by the odd-order distortions of the power amplifier.

Cartesian loops are used to reduce the odd-order distortions of the power amplifier and improve the linearity of the power amplifier. Cartesian loops are feedback loops, which includes a path which generates a baseband I/Q signals by branching part of the power of the transmit RF signal and inputting the power to a quadrature demodulator, and feeds the power back to the input of a quadrature modulator for transmission.

More specifically, part of the power of the transmit RF signal output from the power amplifier is transmitted to the feedback path of the Cartesian loop, and input to the quadrature demodulator through a variable attenuator and a low noise amplifier. Feedback I/Q signals obtained by the quadrature demodulator are combined (added or subtracted) with input I/Q signals. The combined I/Q signal is input to the quadrature modulator through a baseband amplifier. When the gain from the quadrature modulator to the quadrature demodulator is sufficiently larger than 1, the gain from the input end of the quadrature modulator to the output end of the power amplifier is determined by the attenuation amount of the feedback path of the Cartesian loop, and the linearity of the transmit RF signal depends on the linearity of the feedback path. Therefore, it is necessary to enhance the linearity of the feedback path.

On the other hand, since mobile terminals operate with a built-in battery used as a power source, IC low-power-consumption technology is indispensable to reduce exhaustion of the battery and extend the communication time. In mobile terminals, the power consumption of the power amplifier for transmission is the largest. With increase in packing density of the radio unit used for mobile terminals, recently the radio units have been manufactured by complementary metal-oxide semiconductor (CMOS) technology, which is suitable for cost reduction. Generally, although power amplifiers having a CMOS structure can achieve cost reduction, the efficiency thereof decreases. Cartesian loop technology is linearity increasing technology for the radio unit as described above, but also can be regarded as technology for increasing the efficiency of the power amplifier. Therefore, the efficiency of the power amplifier or the radio unit can be increased by applying a Cartesian loop to the radio unit of the CMOS structure.

Since Cartesian loops have a feedback path, it is important how the operation stability is secured. To secure the stability of Cartesian loops, JP-A H10-136048 (KOKAI) proposes a method of controlling the phase of a local signal supplied to the quadrature demodulator in the feedback path, in accordance with the phase difference between the feedback I/Q signals and the input I/Q signals. However, in JP-A H10-136048 (KOKAI), it is not considered to render the power (transmission power) of the transmit RF signal variable.

When a Cartesian loop is used, it is possible to reduce the power consumption of the whole transmission apparatus even in consideration of the power consumption of the feedback path in high output of the transmit RF signal. On the other hand, in low output of the transmit RF signal, the linearity of the power amplifier and the driver amplifier driving the power amplifier is high, and thus it is not necessary to increase the linearity thereof by using a Cartesian loop. When a Cartesian loop operates also in low output, the efficiency decreases due to the power consumption of the feedback path. Therefore, to efficiently perform transmission power control used in recent radio systems, it is desirable to close and open the Cartesian loop according to the transmission power, from the viewpoint of reduction in power consumption.

When a Cartesian loop is opened and closed according to the transmission power, a transient response time since the loop is closed until the transmission power reaches a predetermined value increases. For example, when an average output of the input I/Q signals before the loop is closed is set to 100 mV, supposing that the gain of the variable attenuator in the feedback path is set such that the average output of the feedback I/Q signals is 1000 mV, the transmission power when the loop is closed is different from the transmission power when the loop is opened. Therefore, the time necessary for convergence of the transmission power since the loop is closed is increased. When operation is performed to set the transmission power by controlling the gain of the variable attenuator in the feedback path after the loop is closed, the convergence time of the transmission power is further increased. JP-A H10-136048 (KOKAI) does not disclose a concept of transmission power control, and thus does not disclose any method of reducing the convergence time of the transmission power in closing and opening of the Cartesian loop.

BRIEF SUMMARY OF THE INVENTION

According to an aspect of the present invention, there is provided a radio transmitter comprising: a combiner which combines input I/Q signals to be transmitted with feedback I/Q signals to generate combined I/Q signals; a quadrature modulator which performs quadrature modulation on the combined I/Q signals to generate a quadrature modulated signal; a power amplifier which amplifies the quadrature modulated signal to output a transmission RF signal; a quadrature demodulator which performs quadrature demodulation, by using a local signal, on a feedback RF signal branched from the transmit RF signal to generate the feedback I/Q signals; a detector which detects each amplitude difference and each phase difference between the input I/Q signals and the feedback I/Q signals; a switch to turn on and off input of the feedback I/Q signals to the combiner; a power setting unit which sets transmission power of the transmit RF signal; a control signal generator to generate at least one amplitude control signal which minimizes the amplitude difference and at least one phase control signal which minimizes the phase difference, in a state where the transmission power is set, during for a period during which the switch is turned off; a memory which stores the amplitude control signal and the phase control signal; an amplitude adjuster which adjusts an amplitude of the feedback I/Q signal in accordance with the amplitude control signal stored in the memory, during for a period during which the switch is turned on; a phase adjuster which adjusts a phase of the local signal in accordance with the phase control signal stored in the memory, during for the period during which the switch is turned on; and a gain setting unit which sets a first loop gain for a Cartesian loop when the switch is turned off, and sets a second loop gain higher than the first loop gain for the Cartesian loop when the switch is changed from an off state to an on state.

According to another aspect of the present invention, there is provided a method of controlling a Cartesian loop formed to feed back feedback I/Q signals, which are obtained by demodulating a feedback RF signal branched from a transmit RF signal by using a local signal, comprising: setting the transmission power of the transmit RF signal; setting a first loop gain for the Cartesian loop when the Cartesian loop is opened; generating an amplitude control signal which minimizes each amplitude difference between input I/Q signals to be transmitted under a state where the transmission power is set and the feedback I/Q signals, in a period during which the Cartesian loop is opened; generating a phase control signal which minimizes each phase difference between the input I/Q signals and the feedback I/Q signals; storing the amplitude control signal and the phase control signal; setting a second loop gain higher than the first loop gain for the Cartesian loop when the Cartesian loop changes from an opened state to a closed state; adjusting an amplitude of the feedback RF signal in accordance with the stored amplitude control signal, in a period during which the Cartesian loop is closed; and adjusting a phase of the local signal in accordance with the stored phase control signal, in the period during which the Cartesian loop is closed.

DETAILED DESCRIPTION OF THE INVENTION

Embodiments of the present invention will be described below with reference to drawings.

First Embodiment

Figure 1:
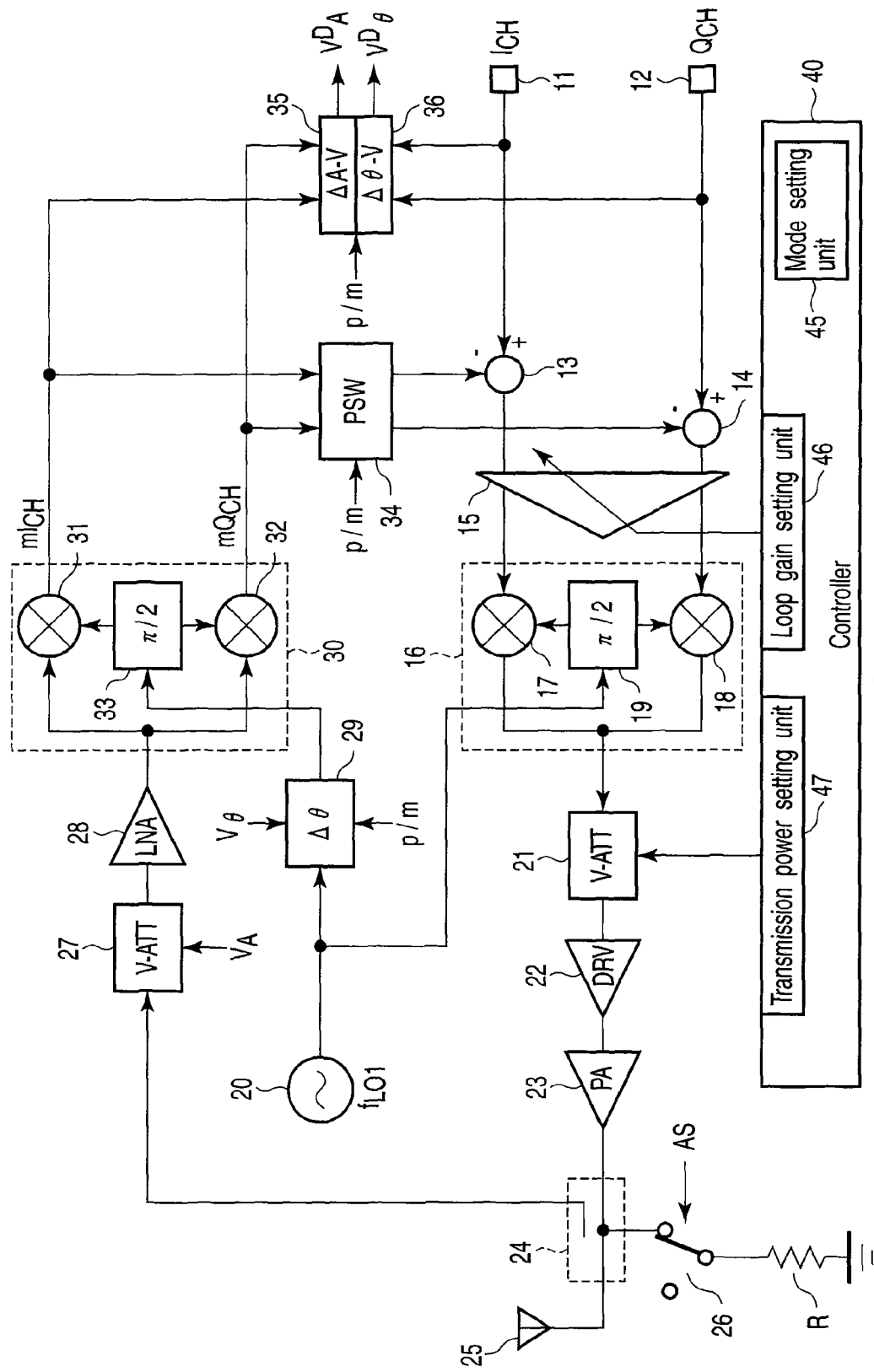
FIG. 1 is a block diagram of a radio transmitter according to an embodiment.

A radio transmitter according to an embodiment of the present invention is explained with reference to FIG. 1. In FIG. 1, to-be-transmitted input I/Q signals $I_{CH}$ and $Q_{CH}$ are input to input terminals 11 and 12, respectively, from a baseband processing section (not shown) or a controller 40. The input I/Q signals $I_{CH}$ and $Q_{CH}$ are combined (added or subtracted) with feedback I/Q signals $mI_{CH}$ and $mQ_{CH}$ by combiners 13 and 14, respectively, and thereby combined I/Q signals are generated. The combined I/Q signals are amplified by a baseband amplifier 15, and then input to a quadrature modulator 16. A variable gain amplifier is preferably used as the baseband amplifier 15. The baseband amplifier 15 also includes a filtering function to secure the stability of the radio transmitter, if necessary.

The quadrature modulator 16 has mixers 17 and 18, and 90° phase shifter 19. The 90° phase shifter 19 shifts the phase of a local signal having a frequency $f_{LO}$ from a local oscillator 20, and generates quadrature local signals, that is, two local signals having phases which are different by 90°. The mixers 17 and 18 multiply the respective combined I/Q signals from the base band amplifier 15 by the respective quadrature local signals. In the quadrature modulator 16, the output signals of the mixers 17 and 18 are added, and thereby a quadrature modulated signal is generated.

The quadrature modulated signal output from the quadrature modulator 16 is input to a power amplifier 23 through a variable attenuator 21 and a driver amplifier 22, and amplified to a required power level by the power amplifier 23. Thereby, a transmit RF signal is generated. The transmit RF signal is supplied to an antenna 25 through a power coupler 24 serving as a power branch device, and radiated to space from the antenna 25. The power of the transmit RF signal is referred to as transmission power hereinafter.

Figure 2:
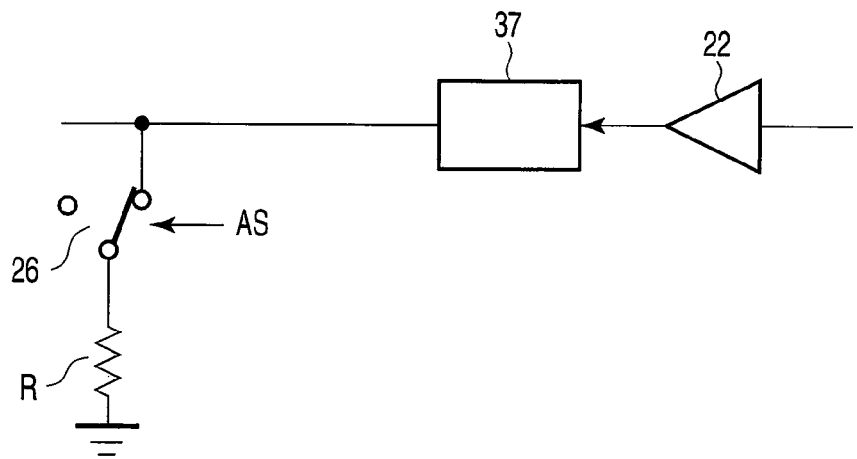
FIG. 2 is a diagram illustrating another example of a termination method of an output of a power amplifier.

The output terminal of the power amplifier 23 is terminated as appropriate by an antenna switch 26 through a termination device, that is, a resistor R in this example. Other linear devices can be used as the termination device instead of the resistor R. The output terminal of the power amplifier 23 is terminated to the ground GND of the radio unit through the resistor R in FIG. 1. However, when an isolator 37 is connected to the output terminal of the power amplifier 23 as illustrated in FIG. 2, the output terminal of the isolator 37 can be terminated by the resistor R or the like. To simplify the explanation, hereinafter explained is the case where the output terminal of the power amplifier 23 is terminated as illustrated in FIG. 1.

The power coupler 24 branches part of the transmission power, and generates a feedback RF signal. The feedback RF signal is input to a quadrature demodulator 30 through a variable attenuator 27 and a low noise amplifier 28. The variable attenuator 27 is used as an amplitude adjuster for adjusting the amplitude of the feedback RF signal.

The quadrature demodulator 30 has mixers 31 and 32 and a 90° phase shifter 33. The 90° phase shifter 33 shifts the phase of a local signal having a frequency $f_{LO1}$ and supplied from the local oscillator 20 through a variable phase shifter 29, and generates quadrature local signals, that is, two local signals having phases which are different by 90°. The variable phase shifter 29 is used as a phase adjuster for adjusting the phase of the quadrature local signals. The mixers 31 and 32 multiply the input feedback RF signal by the respective quadrature local signals, and thereby generate feedback I/Q signals $mI_{CH}$ and $mQ_{CH}$, respectively.

The feedback I/Q signals $mI_{CH}$ and $mQ_{CH}$ are fed back to the combiners 13 and 14, respectively, through a switch 34 having a polarity reversal function. The Cartesian loop is formed of a feedback loop including a feedback path, which is formed by the power coupler 24, the variable attenuator 27, the low noise amplifier 28, the phase demodulator 30, and the combiners 13 and 14, and a transmission path, which is formed by the combiners 13 and 14, the baseband amplifier 15, the quadrature modulator 16, . . . , and the power amplifier 23. The switch 34 is provided to open and close the Cartesian loop, more specifically, to turn on and off the input of the feedback I/Q signals to the combiners 13 and 14. When the switch 34 is turned on, the Cartesian loop is closed. When the switch 34 is turned off, the Cartesian loop is opened.

Further, there are provided an amplitude difference detector 35 and a phase difference detector 36, which detect the amplitude difference and the phase difference, respectively, between the feedback I/Q signals $mI_{CH}$ and $mQ_{CH}$ and the input I/Q signals $I_{CH}$ and $Q_{CH}$. The amplitude difference detector 35 outputs an amplitude difference detection signal $V^D_A$, and the phase difference detector 36 outputs a phase difference detection signal $V^D_\theta$.

Figure 3:
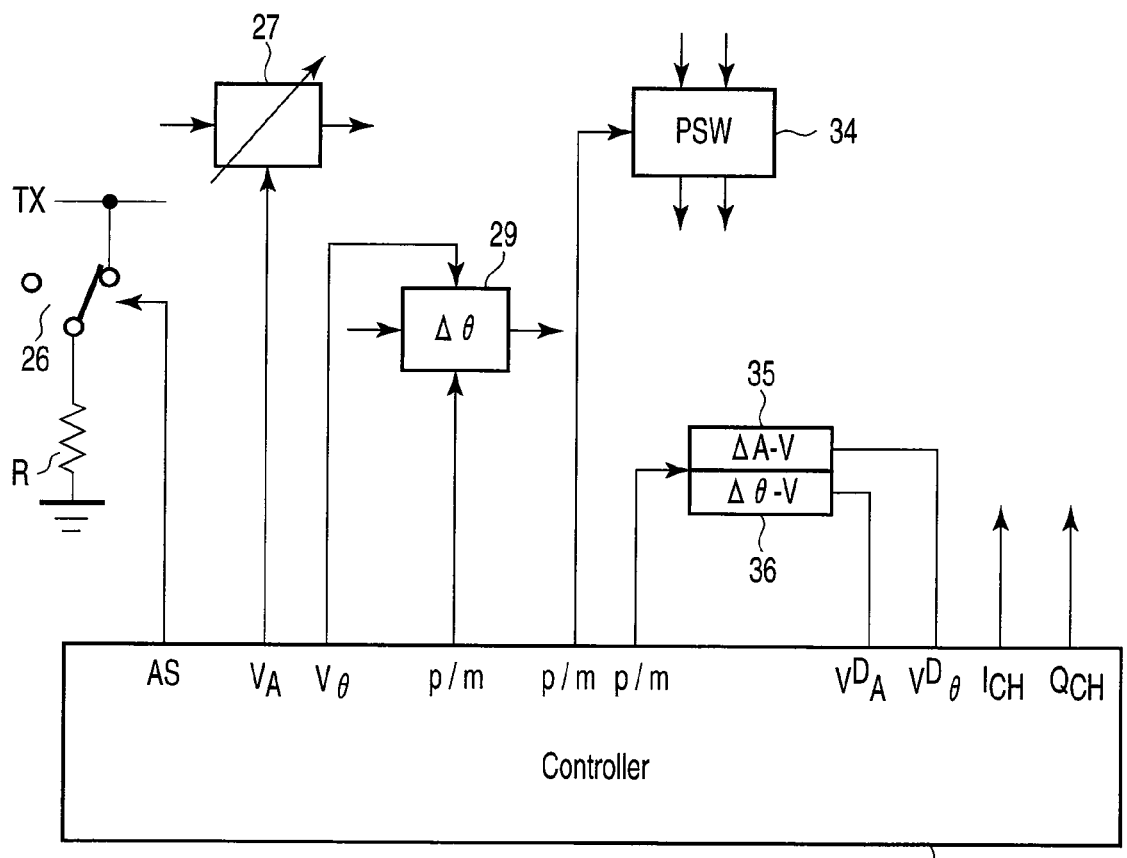
FIG. 3 is a diagram illustrating a function of a controller.

When calibration is performed, the switch 34 is turned off, that is, the Cartesian loop is opened. The state where the switch 34 is turned off is referred to as "calibration mode" hereinafter. When a signal is transmitted, the switch 34 is turned on, that is, the Cartesian loop is closed. Thereby, feedback by the Cartesian loop is performed. This state is referred to as "transmission mode". As illustrated in FIG. 3 as an example, the controller 40 is configured to control the Cartesian loop. FIG. 3 shows that various control signals illustrated in FIG. 1 are output from the controller 40.

Specifically, the controller 40 outputs an amplitude control signal $V_A$ to the variable attenuator 27, a phase control signal $V_\theta$ to the variable phase shifter 29, and polarity control signals p/m to the variable phase shifter 29, the switch 34, the amplitude difference detector 35 and the phase difference detector 36. The amplitude difference detection signal $V^D_A$ from the amplitude difference detector 35 and the phase difference detection signal $V^D_\theta$ from the phase difference detector 36 are input to the controller 40. Further, the controller 40 also outputs the input I/Q signals $I_{CH}$ and $Q_{CH}$ and a control signal AS to the antenna switch 26. As long as the type of signals used as the input I/Q signals $I_{CH}$ and $Q_{CH}$ can be controlled by the controller 40, the signals $I_{CH}$ and $Q_{CH}$ are not always output from the controller 40.

(Specific Example 1 of the Controller 40)

Figure 4:
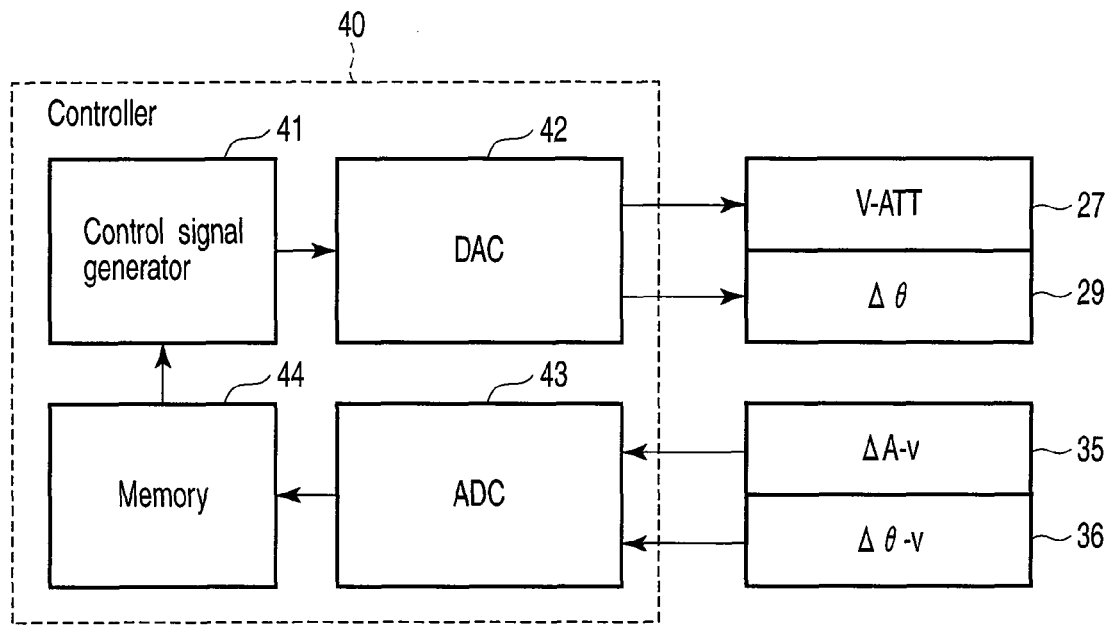
FIG. 4 is a block diagram illustrating a specific example of the controller.

FIG. 4 is a specific example of the controller 40, which includes a control signal generator 41, a digital-analogue converter (DAC) 42, an analogue-digital converter (ADC) 43, and a memory 44. A digital control signal generated by the control signal generator 41 is converted into an analogue signal by the DAC 42, and thereby an amplitude control signal $V_A$ and a phase control signal $V_\theta$ are generated. The amplitude control signal $V_A$ is supplied to the variable attenuator 27, and the phase control signal $V_\theta$ is supplied to the variable phase shifter 29.

On the other hand, the amplitude difference detection signal $V^D_A$ from the amplitude difference detector 35 and the phase difference detection signal $V^D_\theta$ from the phase difference detector 36 are input to the ADC 43, and converted from analogue signals into digital values. The memory 44 is connected to the control signal generator 41 and the ADC 43, and used for storing the amplitude difference detection signal and the phase difference detection signal converted into digital values by the ADC 43, and for outputting the stored amplitude difference detection signal and the phase difference detection signal to the control signal generator 41.

(Specific Example 2 of the Controller 40)

Figure 5:
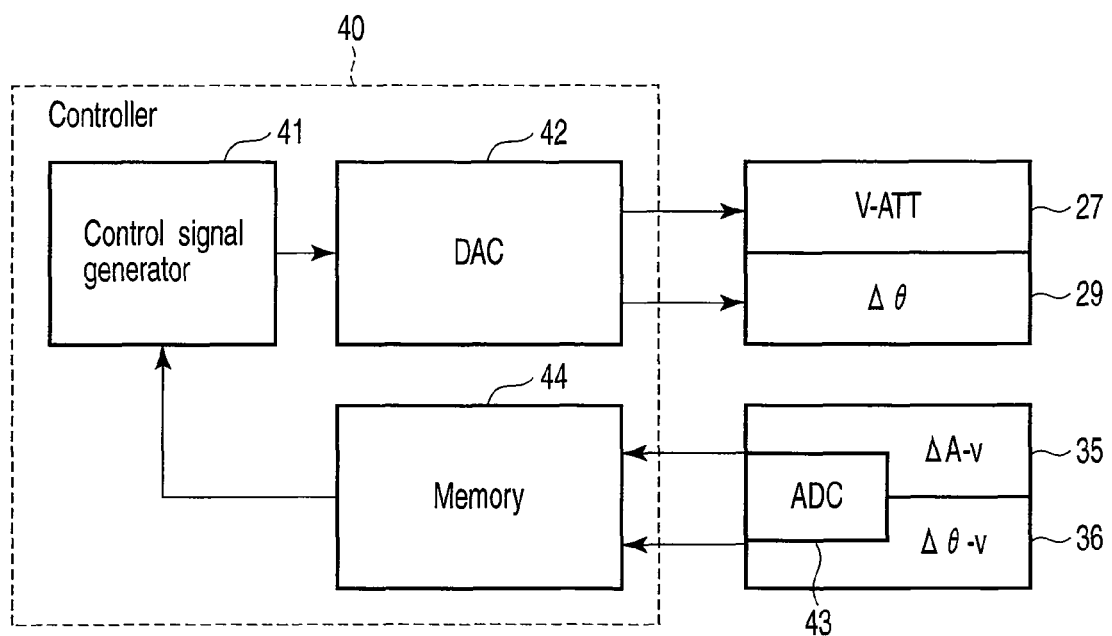
FIG. 5 is a block diagram illustrating another specific example of the controller.

According to another example of the controller 40, the ADC 43 is removed as illustrated in FIG. 5, and the ADC 43 is contained in the amplitude difference detector 35 and the phase difference detector 36. Although the ADC 43 is shared between the amplitude difference detector 35 and the phase difference detector 36 in this example, an ADC 43 may be contained in each of the amplitude difference detector 35 and the phase difference detector 36. According to the example of FIG. 5, a digital amplitude difference detection signal and a digital phase difference detection signal are output from the amplitude difference detector 35 and the phase difference detector 36, respectively, and directly taken into the memory 44.

Although not shown in FIGS. 4 and 5, the controller 40 is further provided with a mode setting section 45 which selectively sets the calibration mode and the transmission mode, a loop gain setting section 46, and a transmission power setting section 47, as illustrated in FIG. 1.

In the first embodiment, to shorten the response time by opening/closing of the Cartesian loop, it is aimed to reduce the difference in signal amplitude of the sections before and after feedback as much as possible. Specifically, the signal amplitude after feedback is performed by the Cartesian loop is estimated, and the signal amplitude is attempted to be set before the Cartesian loop is closed and feedback is performed. To achieve such processing, the amplitude and the phase are adjusted by the following procedure before feedback is performed by the Cartesian loop.

(Calibration Mode)

Figure 6:
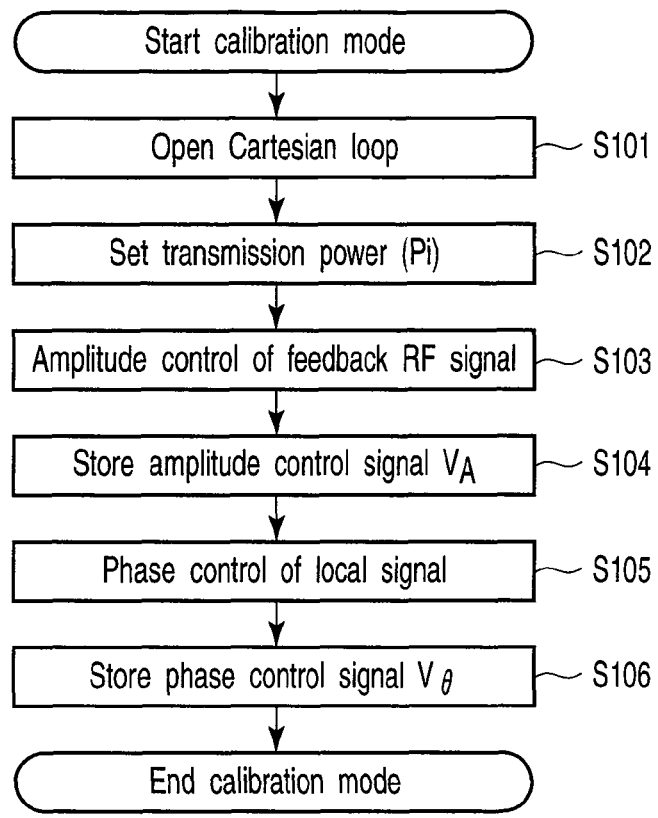
FIG. 6 is a flowchart illustrating a processing procedure of a calibration mode.

A processing procedure in the calibration mode is explained below with reference to FIG. 6. The procedure of FIG. 6 is controlled by the controller 40.

When the calibration mode is started, the Cartesian loop is opened by turning off the switch 34 (Step S101). In this step, to prevent output of the transmit RF signal from the antenna 25, the output terminal of the power amplifier 23 or the output terminal of the isolator 37 is terminated by the resistor R by using the antenna switch 26. A control signal AS, which controls whether the output terminal of the power amplifier 23 or the output terminal of the isolator 37 is terminated or not, is supplied from the controller 40 to the antenna switch 26.

Since the amplitude of the feedback RF signal and the phase of the local signal are controlled in the calibration mode, single-tone signals of a fixed frequency having different phases by 90°, typically sine wave signals are preferably input as the input I/Q signals $I_{CH}$ and $Q_{CH}$ being baseband signals. Such single-tone signals have little amplitude fluctuation, and are useful for calibration.

The controller 40 recognizes a desired transmission power (Pi) set by the power setting section 47. The attenuation amount of the transmission variable attenuator 21 is set by the controller 40 according to Pi in the state where the Cartesian loop is opened, and thereby the desired transmission power Pi is set (Step S102). In this step, although the transmit RF signal is distorted if the transmission power is the maximum output, a large distortion does not cause any particular problems in the calibration mode.

The feedback RF signal being a part of the power of the transmit RF signal is input to the quadrature demodulator 30 through the power coupler 24, the variable attenuator 27 and the low noise amplifier 2, and feedback I/Q signals $mI_{CH}$ and $mQ_{CH}$ are generated. The amplitude difference detector 35 detects amplitude difference ΔA between the feedback I/Q signals $mI_{CH}$ and $mQ_{CH}$ and the input I/Q signals $I_{CH}$ and $Q_{CH}$, and the controller 40 sets the amplitude control signal $V_A$ to be supplied to the variable attenuator 27 such that the amplitude difference ΔA has the minimum value.

The amplitude of the input I/Q signals $I_{CH}$ and $Q_{CH}$ is defined by the root of $I_{CH}^2 + Q_{CH}^2$, and the amplitude of the feedback I/Q signals $mI_{CH}$ and $mQ_{CH}$ is defined by the root of $mI_{CH}^2 + mQ_{CH}^2$. To simplify the explanation, the amplitude of the input I/Q signals $I_{CH}$ and $Q_{CH}$ is indicated by $I_{CH}^2 + Q_{CH}^2$, and the amplitude of the feedback I/Q signals $mI_{CH}$ and $mQ_{CH}$ is indicated by $mI_{CH}^2 + mQ_{CH}^2$.

To set the amplitude of the feedback I/Q signals $mI_{CH}$ and $mQ_{CH}$ equal to the amplitude of the input I/Q signals $I_{CH}$ and $Q_{CH}$, the attenuation amount of the variable attenuator 27 is controlled by the controller 40, such that the amplitude difference detection signal $V^D_A$ output from the amplitude difference detector 35 becomes close to 0. The signal $V^D_A$ is represented by the following expression (1).

$$V^D_A = (mI_{CH}^2 + mQ_{CH}^2) - (I_{CH}^2 + Q_{CH}^2) \tag{1}$$

The amplitude difference detection signal $V^D_A$ may be calculated by multiplying the right side of the expression (1) by a constant. The expression (1) shows the case where the constant by which the right side is multiplied is 1.

As illustrated in FIGS. 4 and 5, when the amplitude control signal $V_A$ supplied from the controller 40 to the variable attenuator 27 is an analogue signal generated by the DAC 42, the digital value which is input from the control signal generator 41 to the DAC 42 when the amplitude control signal $V_A$ is generated is successively increased or decreased. Thereby, an amplitude control signal $V_A$ which monotonously increases or monotonously decreases (this is referred to as an amplitude calibration control signal) is generated, and the amplitude of the feedback RF signal is adjusted by the amplitude calibration control signal (Step S103). With this processing, the amplitude difference detector 35 detects the amplitude difference between the feedback I/Q signals and the input I/Q signals, and outputs amplitude difference detection signal $V^D_A$. An amplitude calibration control signal which is closest to a zero cross point of the amplitude difference detection signal $V^D_A$, that is, an amplitude calibration control signal when the signal $V^D_A$ changes from positive to negative or from negative to positive provides a desired amplitude adjustment amount. Thereby, the amplitude of the transmit RF signal becomes almost equal to the amplitude of the feedback RF signal. In other words, the loop gain explained later is almost 1. The amplitude calibration control signal which is closest to the zero cross point of the amplitude difference detection signal $V^D_A$ is used as the amplitude control signal $V_A$ which minimizes the amplitude difference between the feedback I/Q signals and the input I/Q signals.

The amplitude control signal $V_A$ generated as described above is converted into a digital value by the ADC 43, and stored in the memory 44 to be used for the next phase adjustment and the transmission mode performed thereafter (Step S104). The digital value stored in the memory 44 is read out when the next phase adjustment is performed, and set in the variable attenuator 27 through the control signal generator 41 and the DAC 42.

After the amplitude control signal $V_A$ is stored in the memory 42 in Step S104, the variable phase shifter 29 is controlled by the phase control signal $V_θ$ output from the controller 40 on the basis of the phase difference Δθ detected by the phase difference detector 36. Thereby, the phase of the local signal supplied to the quadrature demodulator 30, that is, the phase of the feedback I/Q signals are adjusted (Step S105).

The phase adjustment of the local signal in Step S105 is performed such that the vector of ($mI_{CH}$ and $mQ_{CH}$) and the vector of ($I_{CH}$ and $Q_{CH}$) are in-phase. Specifically, supposing that the angle formed by the vector of ($mI_{CH}$ and $mQ_{CH}$) and the vector of ($I_{CH}$ and $Q_{CH}$) is Δθ (phase difference), the phase of the local signal is controlled such that the expression "Δθ=0" is established. The phase difference Δθ is determined according to the following expressions (2) and (3).

$$\cos Δθ = I_{CH} \cdot mI_{CH} + Q_{CH} \cdot mQ_{CH} \tag{2}$$

$$\sin Δθ = I_{CH} \cdot mQ_{CH} - Q_{CH} \cdot mI_{CH} \tag{3}$$

The angle formed by ($I_{CH}$, $Q_{CH}$) and ($mI_{CH}$, $mQ_{CH}$) with which sinΔθ of the expression (3) is equal to 0 has two solutions: 0° and 180°. To distinguish these two solutions, the sign of cos Δθ of the expression (2) is detected. Specifically, Δθ is 0° when cos Δθ is larger than 0, and Δθ is 180° when cos Δθ is smaller than 0. Therefore, the phase control signal $V_θ$ is successively increased to detect "Δθ=0°", and the values of cos Δθ and sin Δθ are detected.

In this processing, when the phase control signal $V_θ$ supplied from the controller 40 to the variable phase shifter 29 is an analogue signal output from the DAC 42, the digital value input from the generator 41 to the DAC 42 when the phase control signal $V_θ$ is generated is successively increased or decreased. Thereby, a phase control signal $V_θ$ which monotonously increases or monotonously decreases (this signal is referred to as "phase calibration control signal") is generated, and in this step a phase calibration control signal which sets sin Δ↓ of the expression (3) to almost 0° is determined as the phase control signal $V_θ$ which minimizes the phase difference between the feedback I/Q signals and the input I/Q signals. Further, the polarity of the feedback I/Q signals $mI_{CH}$ and $mQ_{CH}$ fed back to the combiners 13 and 14 by the switch 34 is controlled, in accordance with the sign of cos Δθ determined in this step.

The polarity of the feedback I/Q signals $mI_{CH}$ and $mQ_{CH}$ is set by the polarity setting signal p/m provided from the controller 40 to the switch 34. When cos Δθ is positive, the polarity of the feedback I/Q signals $mI_{CH}$ and $mQ_{CH}$ is set to positive. When cos Δθ is negative, the polarity of the signals $mI_{CH}$ and $mQ_{CH}$ is set to negative.

The phase control signal $V_\theta$, which is the phase calibration control signal in the vicinity of "sin $\Delta\theta=0$" obtained by the above processing, is converted into a digital signal by the ADC 43, and stored in the memory 44 (Step S106) as a digital value to be used for the transmission mode performed later. Thereby, the calibration mode is ended.

The operation of the above calibration mode is explained briefly. When the Cartesian loop is in the open state, the amplitude control signal $V_A$ supplied to the variable attenuator 27 is adjusted such that a predetermined loop gain (loop gain 1 in this example) for the Cartesian loop is obtained in the vicinity of the desired transmission power (Pi). Next, the phase control signal $V_\theta$ to be supplied to the variable phase shifter 29 is adjusted such that the phase difference between the feedback I/Q signals and the input I/Q signals is 180°. Phase adjustment can be performed with accuracy, by performing phase adjustment after the amplitude adjustment.

(Transmission Mode)

Figure 7:
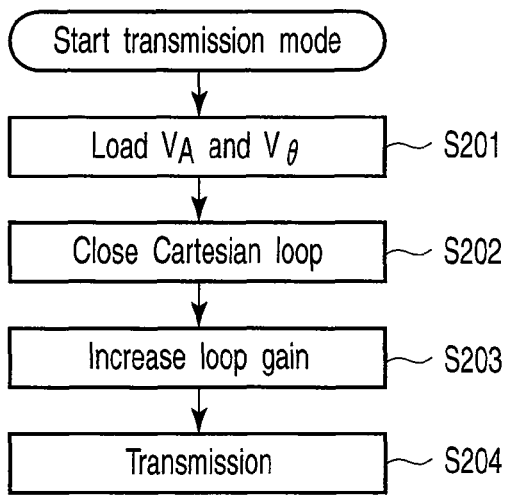
FIG. 7 is a flowchart illustrating a processing procedure of a transmission mode.

Next, the processing procedure in the transmission mode is explained with reference to FIG. 7. The procedure of FIG. 7 is also controlled by the controller 40. When the transmission mode is started, the amplitude control signal $V_A$ and the phase control signal $V_\theta$ are loaded from the memory 44, and set to the variable attenuator 27 and the variable phase shifter 29, respectively (Step S201). Next, the switch 34 is turned on, and thereby the Cartesian loop is closed (Step S202). However, in this processing, the output terminal of the power amplifier 23 or the output terminal of the isolator 37 is terminated by the resistor R, if necessary.

Thereafter, the loop gain is increased (Step S203), and transmission is performed (Step S204). Simultaneously with closing the Cartesian loop in Step S201, the switch 26 is changed to stop termination of the output terminal of the power amplifier 23 or the output terminal of the isolator 37, and is set to connect to the antenna 25. As another example, in consideration of the transient response time, the switch 26 is changed to stop termination of the output terminal of the power amplifier 23 or the output terminal of the isolator 37 with time delayed by the transient response time since the Cartesian loop is closed.

Figure 8:
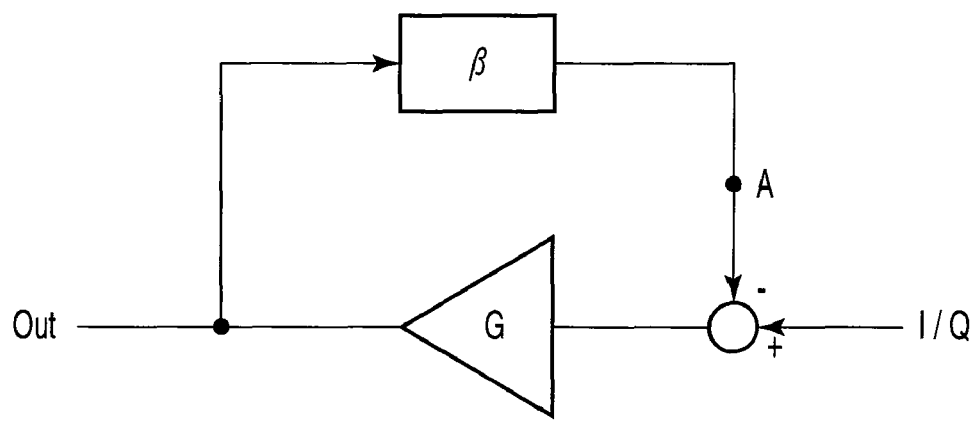
FIG. 8 is a schematic diagram of a feedback system for explaining a Cartesian loop.

Next, explained is the reason for performing the processing of increasing the loop gain in Step S203. Although the Cartesian loop is the two-dimensional loop of I and Q, it is supposed as a one-dimensional loop for simple explanation, and a one-dimensional feedback system as illustrated in FIG. 8 is supposed. Generally, in feedback systems, the following relationship is established when the gain of the amplifying stage (bare gain) is G, the feedback rate is β, the input is I/Q, and the output is Out.

The gain after feedback is represented by $G/(1+G\beta)$. $G\beta$ is called the loop gain. When the expression "$1+G\beta=0$" is satisfied, the denominator is 0, and thus the feedback system becomes unstable. The expression "$1+G\beta=0$" indicates the state where $G\beta$ is 1 and the phase is changed by 180°, when the feedback signal is subtracted from the input signal. Also in the Cartesian loop, it is necessary to perform feedback under the condition where no frequency which causes such a state exists. In the first embodiment, when the Cartesian loop is closed, the expression "$1+G\beta=2$" is established. In this state, not only is the gain halved, but also improvement of distortion cannot be expected.

On the other hand, when the transmitter proceeds to the transmission mode after the calibration mode is finished, and then the Cartesian loop is closed and feedback is performed, the state equivalent to the state "$G\beta=1$" as illustrated in FIG. 5 is obtained. Therefore, in the procedure of FIG. 7, after the amplitude control signal $V_A$ and the phase control signal $V_\theta$ corresponding to the preset transmission power are loaded in Step S201, the Cartesian loop is closed in Step S202, and the loop gain $G\beta$ is set larger than 1 in the next Step S203 to reduce the influence of G. Specifically, the switch 34 is turned on to change the Cartesian loop from the opened state to the closed state with a predetermined polarity, and then the loop gain $G\beta$ is increased.

The subject of adjustment to change the loop gain $G\beta$ is G, which corresponds to the gain from the baseband amplifier 15 to the power amplifier 23, and it is preferable that β is not changed. This is because β corresponds to the gain when the Cartesian loop is performed, and the gain to be set is changed if β is changed. In the first embodiment, the gain of the baseband amplifier 15 is increased by the loop gain setting section 46 as illustrated in FIG. 1, to enhance the gain G. In this example, since the loop gain $G\beta$ in the state where the Cartesian loop is opened is 1, the change of the gain of the baseband amplifier 15 serves as the whole loop gain.

Supposing that the loop gain is sufficiently larger than 1, the desired transmission output is determined by the attenuation amount (amplitude adjustment amount) of the variable attenuator 27 in the feedback path, which has been set when the Cartesian loop is opened in the calibration mode. By setting the amplitude adjustment amount as described above, the amplitude of the feedback I/Q signals $mI_{CH}$ and $mQ_{CH}$ becomes equal to the input I/Q signals $I_{CH}$ and $Q_{CH}$. Therefore, the gain from the input terminals 11 and 12 to the output end of the power amplifier 23 (the gain of the transmission power for the input I/Q signals $I_{CH}$ and $Q_{CH}$) becomes equal to the gain (the reciprocal of the attenuation amount) of the feedback path of the Cartesian loop. Thus, it is unnecessary to adjust the transmission power after the Cartesian loop is closed.

When the processing of the Step S203 is performed, the amplitude of the feedback I/Q signals is set to almost the same amplitude thereof when the Cartesian loop is opened, and thus the transient response time when the Cartesian loop is opened is further shortened.

Figure 9:
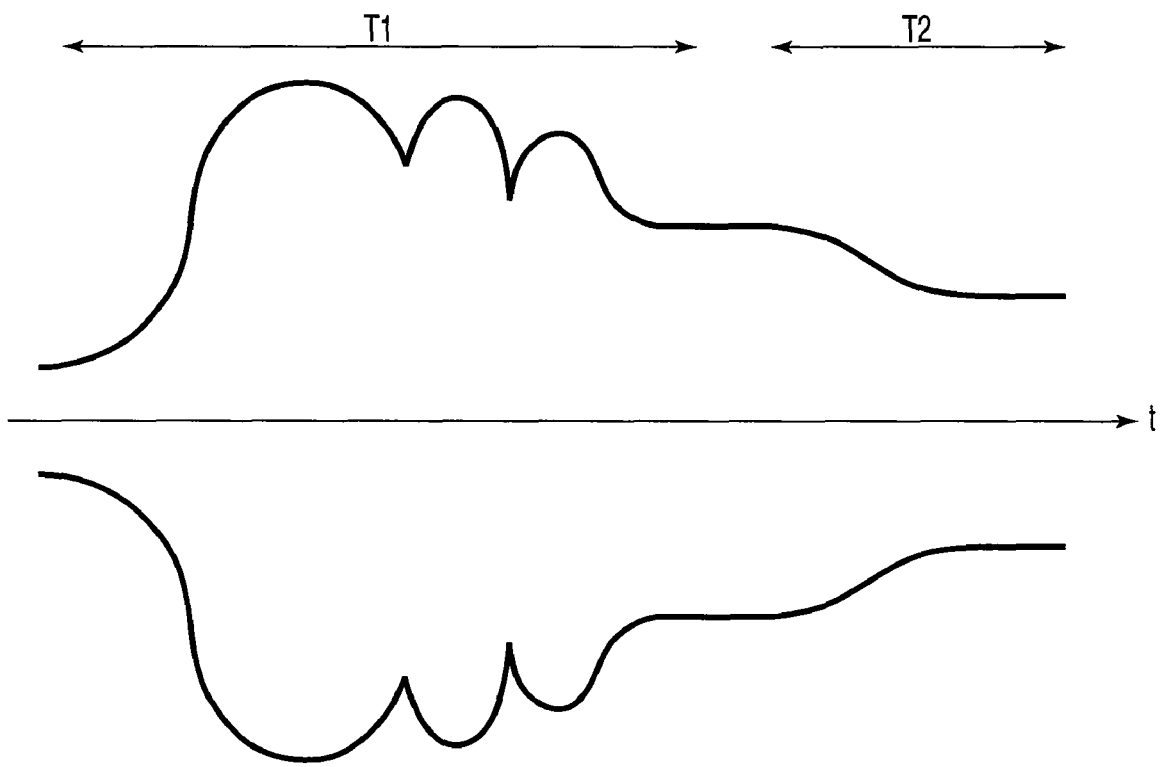
FIG. 9 is a diagram illustrating a transient response when the Cartesian loop is closed and a transient response when the transmission power is changed with the Cartesian loop kept closed.

FIG. 9 illustrates a transient response (T1) of the transmission power when the Cartesian loop is closed without performing the processing procedures as explained with FIGS. 6 and 7, and a transient response (T2) of the transmission power when the transmission power is changed with the Cartesian loop kept closed (when the transmission power is set after the Cartesian loop is closed). According to the first embodiment, these transient responses can be improved.

(Transmission End Processing)

Next, the processing performed when transmission is ended is explained. When transmission is ended, the transmission baseband signals $I_{CH}$ and $Q_{CH}$ are ramped down and the transmission power is reduced. When the transmission power is reduced to a predetermined level, the switch 34 is turned off, and thereby the Cartesian loop is opened. Next, operation of the Cartesian loop is stopped, and the increased amount of the loop gain is restored. For example, the gain of the baseband amplifier 15 is returned to the setting made before feedback by the Cartesian loop is performed, and thereby the loop gain can be restored to the original value, that is, 1.

(Transmission Power Change Processing)

Next, the processing performed when the transmission power is changed is explained. When the transmission power level is set to a reduced value beyond a certain degree, linearization by the Cartesian loop is unnecessary, and thus operation of the Cartesian loop is stopped. In this case, the sequence similar to the above transmission stopping processing is performed.

As another method, the switch 34 is turned off in the first step to open the Cartesian loop, and the gain G is decreased. Specifically, the increased amount of the loop gain added to reduce the gain deviation is removed, and the loop gain is restored to the original state. As an example, the gain of the baseband amplifier 15 is restored to the original state. Next, the Cartesian loop is stopped in the second step.

When operation of the Cartesian loop is necessary although the transmission power level is changed, the following processing is performed. After the processing is performed to the first step, the procedure of the calibration mode explained with FIG. 6 is performed, and the simulated transmission power for the state after the gain is changed is set in the state where the Cartesian loop is opened, and the above phase adjustment is performed. Thereafter, the transmitter proceeds to the transmission mode. As another method, β may be decreased to a predetermined level with the transmission mode maintained, and the gain G of the amplifying stage may be increased by the decreased amount of β.

According to the calibration mode illustrated in FIG. 6, adjustment of the amplitude and the phase is performed directly before the transmission operation illustrated in FIG. 7. Therefore, since the amplitude control signal and the phase control signal are always taken before the Cartesian loop is performed or the transmission power is changed, it is premised that a test is performed with an open loop.

In comparison with this, another calibration mode, explained below, is aimed at further reducing the calibration time required before transmission, and is supposed to be performed when the radio transmitter is started up or when pre-delivery inspection is performed for integrated circuits (IC) on which the radio transmitter is mounted. Therefore, although the calibration mode explained below is referred to as "startup calibration" for the sake of convenience, it is not limited to being performed at startup.

(Startup Calibration Mode)

Figure 10:
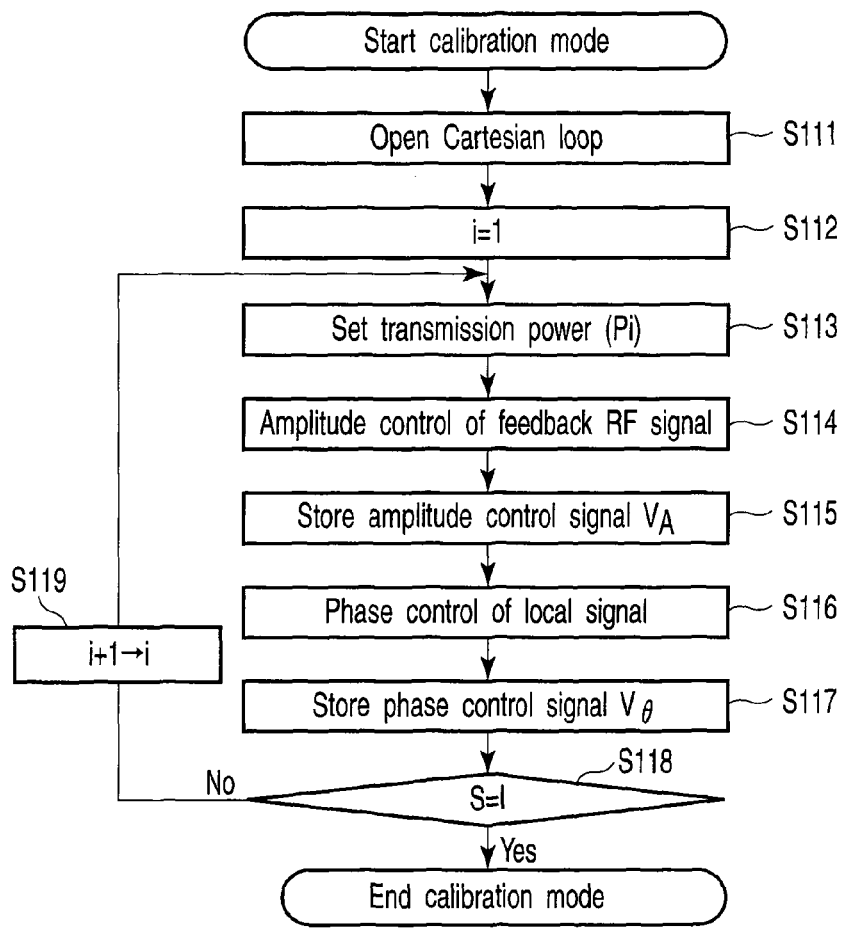
FIG. 10 is a flowchart illustrating a processing procedure of a startup calibration mode.

FIG. 10 illustrates a processing procedure in startup calibration mode. The procedure of FIG. 10 is different from the procedure of FIG. 6 in that the transmission power is changed step by step, and the amplitude control signal $V_A$ and the phase control signal $V_\theta$ for each transmission power are adjusted and stored.

First, when the calibration mode is started, the Cartesian loop is opened by turning off the switch 34 (Step S111). In this step, the output terminal of the power amplifier 23 or the output terminal of the isolator 37 is terminated by the resistor R, to prevent output of the transmit RF signal from the antenna 25.

Next, the value of i is set to 1 in Step S112, and then the transmission power Pi is set (Step S113). First, the transmission power is set to satisfy "Pi=1". Thereafter, in the same manner as Steps S103 to S106 in FIG. 6, performed are amplitude control of the feedback RF signal (Step S114), storing of the amplitude control signal $V_A$ (Step S115), phase control of the feedback I/Q signals (local signal) (Step S116), and storing of the phase control signal $V_\theta$ (Step S117).

Until it is determined that the value of i reaches I in Step S118, i is incremented by 1 in Step S119, and the processing of Steps S113 to S117 is repeated. During the processing, in the transmission power setting step S113, the transmission power is increased in steps of 1 dB, for example, each time i is incremented by 1. As described above, the amplitude control signal $V_A$ and the phase control signal $V_\theta$ adjusted in each transmission power are stored in the memory 44, and the startup calibration mode is ended.

(Transmission Mode)

Figure 11:
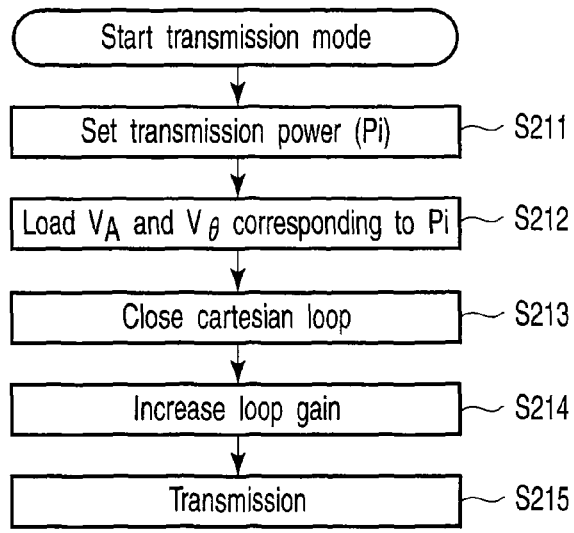
FIG. 11 is a flowchart illustrating a processing procedure of a transmission mode performed after the startup calibration mode.

Next, the processing performed when the Cartesian loop is performed during transmission after the startup calibration explained with reference to FIG. 10 is performed is explained with reference to FIG. 11. First, operation is started in the state where the Cartesian loop is opened with the switch 34 turned off, and a desired transmission power Pi is set (Step S211).

In Steps S115 and S117 of FIG. 10, the amplitude control signal $V_A$ and the phase control signal $V_\theta$ in each transmission power Pi (I=1 to I) are stored in the memory 44. Therefore, the amplitude control signal $V_A$ and the phase control signal $V_\theta$ corresponding to the transmission power set in Step S211 are loaded from the memory 44, and set in the variable attenuator 27 and the variable phase shifter 29, respectively (Step S212). During this step, the output terminal of the power amplifier 23 or the output terminal of the isolator 37 is terminated by the resistor R.

Then, after a predetermined time has passed, the switch 34 is turned on, and the Cartesian loop is closed (Step S213). In this step, termination of the output terminal of the power amplifier 23 or the output terminal of the isolator 37 is stopped.

Next, the loop gain is increased (Step S214) by setting the gain of, for example, the baseband amplifier 15 high in the same manner as Step S203 of FIG. 7, and transmission is started (Step S215).

The transmission end processing and the transmission power change processing are the same as the above, and are not explained here. However, when the transmission power is changed and operation of the Cartesian loop is necessary, the switch 34 is turned off to open the Cartesian loop as the first step, and the gain G is decreased as the second step. Specifically, the increased amount of the loop gain is removed and the loop gain is restored to the original state. Since the amplitude control signal $V_A$ and the phase control signal $V_\theta$ have already been stored in the memory 44, the Cartesian loop is operated by the procedure to the second step, and transmission can be performed by the procedure of FIG. 11 with the predetermined transmission power. As another method, β may be decreased to the predetermined level with the transmission mode maintained, and the gain G of the amplifying stage may be increased by the decreased amount of β.

In the startup calibration mode explained in FIG. 10, first, an initial value is provided to the digital value of the control signal generated by the control signal generator 41 in the controller 40 illustrated in FIG. 5. The amplitude difference detection signal $V^D_A$ and the phase difference detection signal $V^D_\theta$ obtained by the amplitude difference detector 35 and the phase difference detector 36 in this state are stored as digital values in the memory 44 through the ADC 43.

Next, the digital value of the control signal is incremented by 1, for example, and the amplitude difference detection signal $V^D_A$ and the phase difference detection signal $V^D_A$ obtained by the amplitude difference detector 35 and the phase difference detector 36 in this state are also stored as digital values in the memory 44 in the same manner. The same processing is repeated a predetermined number of times (N times). Among the digital values of the amplitude difference detection signals $V^D_A$ stored in the memory 44 as described above, a value by which $V^D_A$ in the expression (1) is 0 or a value closest to the value which satisfies the above is selected. The selected value is taken into the control signal generator 41, and an amplitude control signal $V_A$ is generated.

On the other hand, among the digital values of the phase difference detection signals $V^D_\theta$ stored in the memory 44, a value by which cos Δθ in the expression (2) has a predetermined sign, or sin Δθ in the expression (3) is 0, or a value closest to a value which satisfies the above is selected. The selected value is taken into the control signal generator 41, and a phase control signal $V_\theta$ is generated. Among the digital values of the amplitude difference detection signals $V^D_A$ and the phase difference detection signals $V^D_\theta$ stored in the memory 44, unnecessary information such as digital values other than the digital values of the selected detection signals may be deleted.

The above method is based on feedback performed by the controller 40, and is thus called an adjustment method by digital feedback. Although it is supposed that $V^D_A$, sin Δθ, and cos Δθ in the expressions (1), (2) and (3) are determined as analogue signals in this example, $V^D_A$, sin Δθ, and cos Δθ may be determined by digital operation after $I_{CH}$, $Q_{CH}$, $mI_{CH}$, and $Q_{CH}$ are converted into digital values by, for example, the ADC 43 illustrated in FIG. 5.

As described above, according to the first embodiment, in the state where the Cartesian loop is opened and a desired transmission power is set, the amplitude control signal and the phase control signal which minimize the difference in amplitude and phase are generated, and stored in the memory 44. When transmission is performed, the amplitude control signal and the phase control signal are loaded from the memory 44, and set in the variable attenuator 27, which adjusts the amplitude of the feedback RF signal, and the variable phase shifter 29, which adjusts the phase of the local signal used for quadrature demodulation in the feedback path. Therefore, the difference in the transmission power between when the Cartesian loop is opened and when it is closed can be reduced, and thus the transient response time of the transmission power when the Cartesian loop is changed from the opened state to the closed state is effectively shortened. Thereby, the Cartesian loop can be opened and closed according to the transmission power even in radio communication systems which require transmission power control, and thus reduction in power consumption can be achieved.

Second Embodiment

In the first embodiment, feedback control is performed by the controller 40, in the method of amplitude adjustment and phase adjustment in the calibration mode using digital feedback. However, it is also possible to generate an amplitude control signal and a phase control signal necessary for the transmission mode solely by analogue processing in the calibration mode. However, since control signals obtained by analogue processing are analogue signals, it is necessary to take the analogue control signals into the controller 40, convert them into digital values by the ADC 43 and store them in the memory 44, for the transmission mode performed later.

Figure 12:
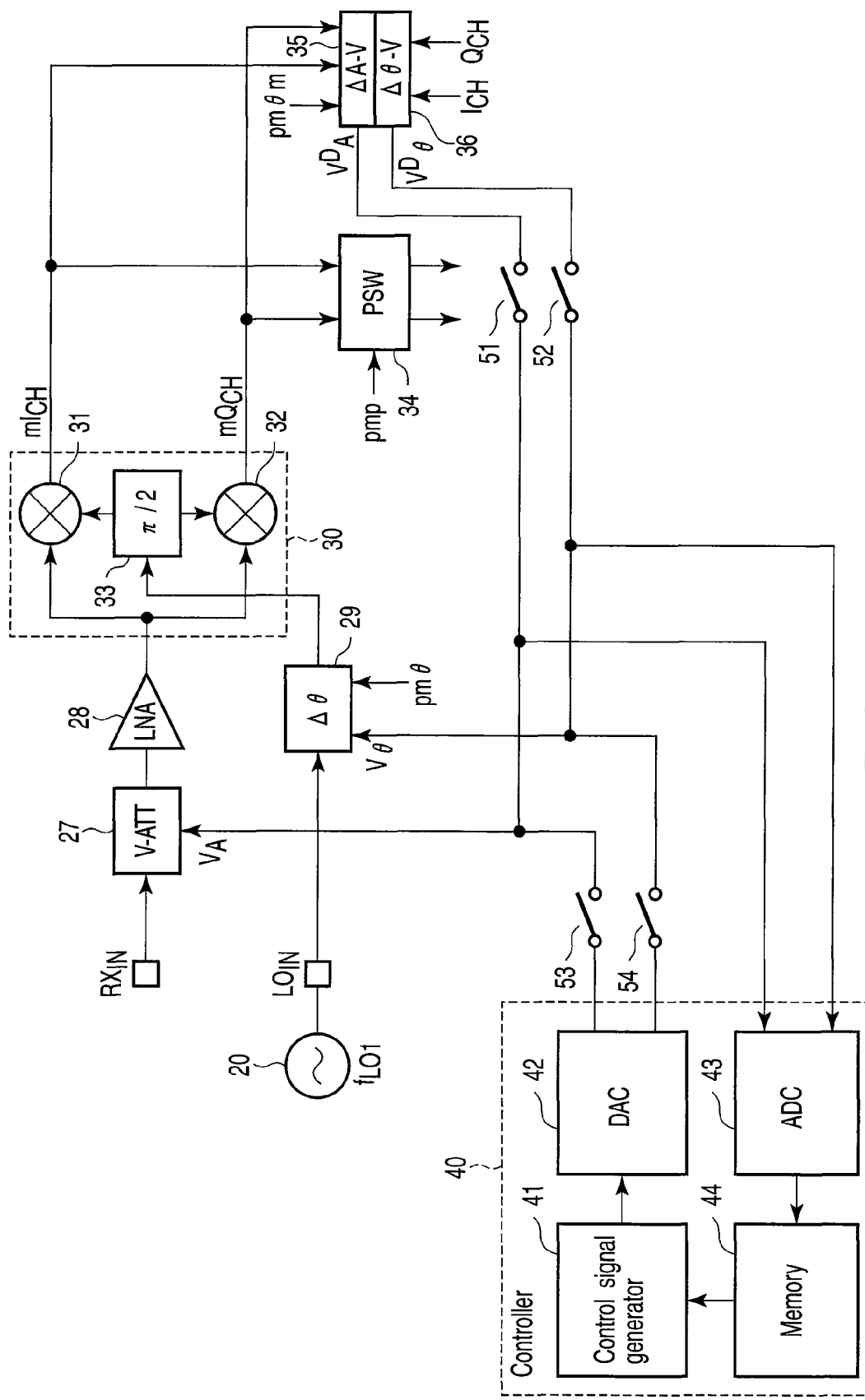
FIG. 12 is a block diagram illustrating a part of a radio transmitter using analogue feedback according to another embodiment.

As the second embodiment of the present invention, explained below is a method of generating an amplitude control signal and a phase control signal by analogue feedback, with reference to FIG. 12. FIG. 12 illustrates a part of the structure common to FIG. 1, with switches 51 and 52 in a control signal feedback loop newly added. In the calibration mode, the amplitude control signal $V_A$ and the phase control signal $V_\theta$ are generated as follows.

First, explained is a method of generating an amplitude control signal $V_A$ by analogue feedback. The switch 34 in the feedback path of the Cartesian loop is turned off, and the output terminal of the power amplifier 23 or the output terminal of the isolator 37 is terminated. The variable attenuator 27 in the feedback path of the Cartesian loop is supplied with a minute amount of transmission power branched from the transmit RF signal being the output of the power amplifier 23, as a feedback RF signal. Further, suppose that the feedback path of the Cartesian loop has already been powered. When the amplitude of the feedback RF signal is adjusted, the switch 51 is turned on, and the switch 52 is turned off. While the switch 52 is in the OFF state, a predetermined reference control signal is applied to the variable phase shifter 29.

The amplitude difference detector 35 and the phase difference detector 36 perform processing of the expression (1) by analogue processing for the input I/Q signals $I_{CH}$ and $Q_{CH}$ and the feedback I/Q signals $mI_{CH}$ and $mQ_{CH}$ in the same manner as the first embodiment. Thereby, an analogue amplitude difference detection signal $V^D_A$ (or a signal obtained by multiplying $V^D_A$ by a constant) is input to the variable attenuator 27 as an amplitude control signal $V_A$ (this is refereed to as an "amplitude calibration control signal"). Specifically, by the feedback loop including the variable attenuator 27, the lower noise amplifier 28, the quadrature demodulator 30, and the amplitude difference detector 35, the stable point of $V_A$ can be approximated to the point of "$mI_{CH}=I_{CH}$, $mQ_{CH}=Q_{CH}$".

For example, supposing that the signal amplitude of the input terminal $RX_{IN}$ of the variable attenuator 27 is larger, and the amplitude mM of the vector ($mI_{CH}$, $mQ_{CH}$) is sufficiently larger than the amplitude M of the vector ($I_{CH}$, $Q_{CH}$), $V^D_A$ has a large positive value by the expression (1), and the value of $V^D_A$ is fed back as the amplitude control signal $V_A$ to the variable attenuator 27. Suppose that the variable attenuator 27 is designed such that the attenuation amount thereof increases as the value of the amplitude control signal $V_A$ increases. Since a large $V^D_A$ is input as the amplitude control signal $V_A$, the attenuation amount of the variable attenuator 27 is increased. Thereby, the amplitude mM is decreased, and converged to a value almost equal to the amplitude M. The converged value of the amplitude mM is taken into the controller 40 as a digital value through the ADC 43, and stored in the memory 44. Thereafter, the switch 51 is turned off, and the amplitude control signal $V_A$ is input to the variable attenuator 27 from the controller 40. This processing is described later.

Next, explained is a method of generating a phase control signal $V_\theta$ by analogue feedback. When the phase is adjusted, the switch 51 is turned off, and the switch 52 is turned on. By turning on the switch 52, a phase control loop formed of the variable phase shifter 29, the quadrature demodulator 30, and the phase difference detector 36 is formed.

In the phase control loop, the phase difference Δθ between the vector ($mI_{CH}$, $mQ_{CH}$) and the vector ($I_{CH}$, $Q_{CH}$) is detected by using the expressions (2) and (3). In the phase control loop, the signal of sin Δθ of the expression (3) is used among them. Since the expression "sin Δθ=0" is satisfied when the vector ($mI_{CH}$, $mQ_{CH}$) and the vector ($I_{CH}$, $Q_{CH}$) are in phase or in opposite phase, it is converged at that point convergence takes place at that point. However, since 0° and 180° cannot be distinguished from each other, they are distinguished by the value of cos Δθ. When cos Δθ is positive, it is determined as 0°, that is, the vectors are in phase. When cos Δθ is negative, it is determined as 180°, that is, the vectors are in opposite phase. The value of $V_\theta$ and the value of cos Δθ obtained as described above are taken into the controller 40 through the ADC 43, and stored in the memory 44.

When the Cartesian loop is closed, the switch 34 is turned on, and the polarity of connection is selected by the switch 34 according to the polarity of cos Δθ. On the other hand, as for the phase control signal $V_\theta$, after the switch 52 is turned off, the same voltage as the voltage detected by the ADC 43 is generated as the phase control signal $V_\theta$ through the control signal generator 41 and the DAC 42.

The values of the amplitude control signal $V_A$ and the phase control signal $V_\theta$ stored in the memory 44 as described above are used in the transmission mode. Further, the amplitude control signal $V_A$ stored in the memory 44 is also used when the phase control signal $V_\theta$ is adjusted in calibration.

The structure of the controller 40 is explained below. As illustrated in FIG. 12, the DAC 42 of the controller 40 is connected to the variable attenuator 27 and the variable phase shifter 29 through switches 53 and 54, respectively, and the ADC 43 is connected to the amplitude difference detector 35 and the phase difference detector 36 through the switches 51 and 52, respectively. By turning on the switch 51, the amplitude control signal $V_A$ is taken into the memory 44 through the ADC 43 of the controller 40. By turning on the switch 52, the phase control signal $V_\theta$ is taken into the memory 44 through the ADC 43. Further, when the transmission mode is started, the amplitude control signal $V_A$ is loaded to the variable attenuator 27 by turning on the switch 53, and the phase control signal $V_\theta$ is loaded to the variable phase shifter 29 through the DAC 43 by turning on the switch 54. Next, explained are specific examples of constituent elements in the Cartesian loop in the first and second embodiments.

(Specific Example of Variable Attenuator)

Figure 13:
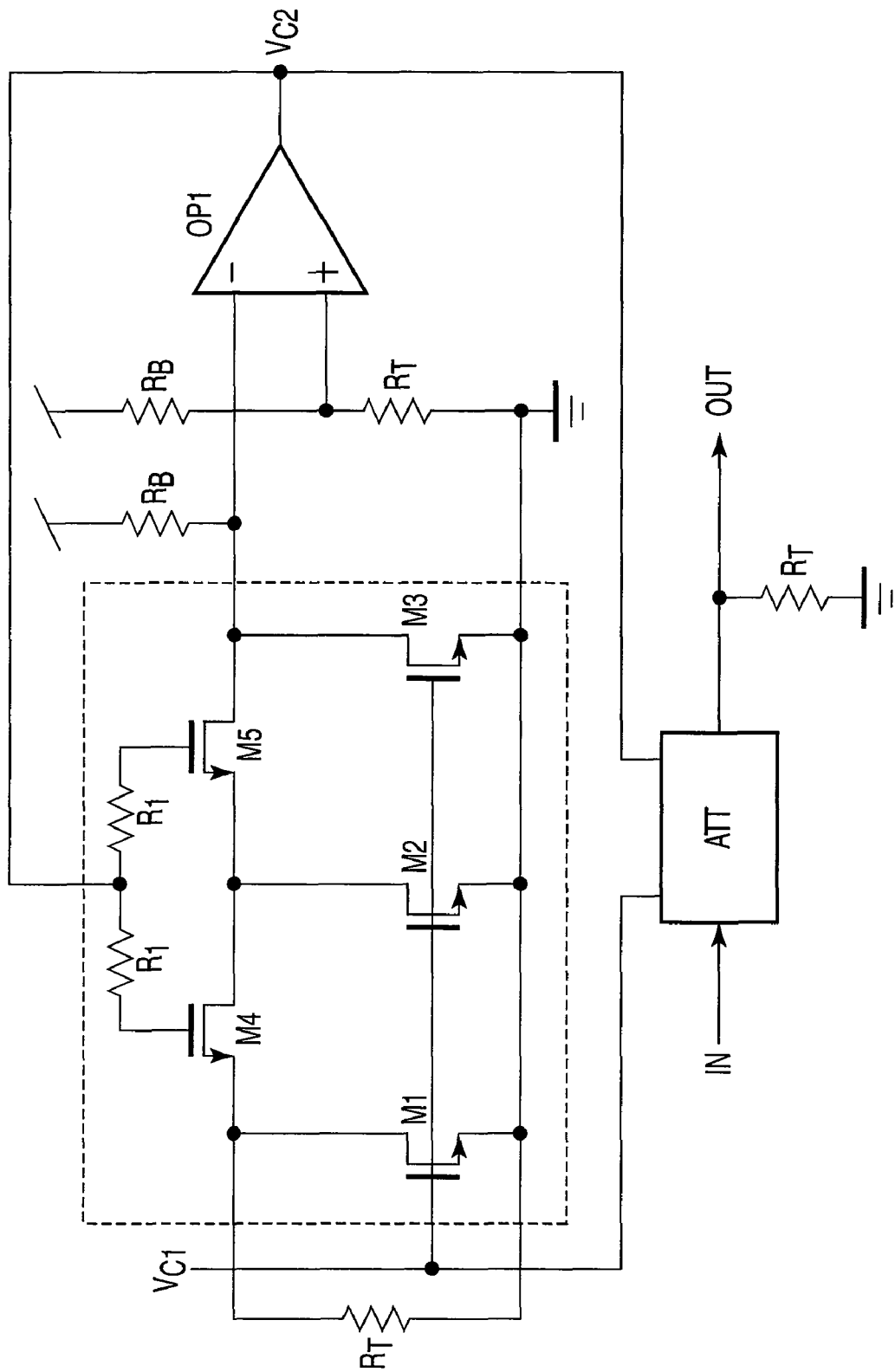
FIG. 13 is a circuit diagram illustrating a specific example of a variable attenuator.

FIG. 13 illustrates a specific example of the variable attenuator. In FIG. 13, a block enclosed by a broken line is a dummy attenuator, and a block indicated by ATT is an attenuator having the same circuit as that of the dummy attenuator. The dummy attenuator is a variable attenuator including MOSFETs M1 to M5 and resistors R1 and R2. Since the attenuator ATT has the same structure as that of the dummy attenuator, it is supposed as also having MOSFETs M1 to M5 and resistors R1 and R2.

MOSFETs M1, M2 and M3 form a path to shunt signals to ground GND, and control the amount of signals flowing into the ground GND. On the other hand, MOSFETs M4 and M5 form a through path, and control the amount of signals transmitted to the circuit of the next stage. The resistor R1 is used for transmitting a direct-current component to gate terminals of M4 and M5.

One end of each of resistors $R_B$ and $R_T$ is connected to the + input terminal of operation amplifier OP1, the other end of $R_B$ is connected to power source $V_{DD}$, and the other end of $R_T$ is connected to the ground GND. One end of another resistor $R_B$ is connected to $V_{DD}$, and the other end thereof is connected to the drain terminal of the MOSFET M5 in the dummy attenuator. One end of another $R_T$ is connected to GND, and the other end thereof is connected to the source terminal of the MOSFET M4 of the dummy attenuator. A common terminal of the two resistors $R_1$ of the dummy attenuator is connected to the output terminal of the operation amplifier OP1, and a common terminal of resistors $R_1$ of the attenuator ATT. The gain control signal $V_{C1}$ is supplied to the gate terminals of the MOSFETs M1, M2 and M3 in the dummy attenuator and the attenuator ATT.

According to the structure of FIG. 13, the gain control signal $V_{C1}$ and the gain of the attenuator ATT (=OUT/IN) exhibit a linear-in-dB characteristic, which is disclosed in the document of H. Dogan, et al., "A DC-10 GHz Linear-in-dB Attenuator in 0.13 um CMOS Technology", IEEE 2004 CICC, pp. 609-612.

(Threshold Value Fluctuation Compensation Interface)

In the variable attenuator of FIG. 13, when threshold value fluctuation (Vth fluctuation) occurs due to process fluctuation of the MOSFETs, the resistances of the MOSFETs vary even when the gain control signal $V_{C1}$ is fixed. This is because the output resistance of MOSFETs depends on a value obtained by subtracting the threshold voltage $V_{th}$ from the gate-source voltage $V_{GS}$. Further, the threshold fluctuation of MOSFETs may cause problems also in the variable phase shifter described later.

Figure 14:
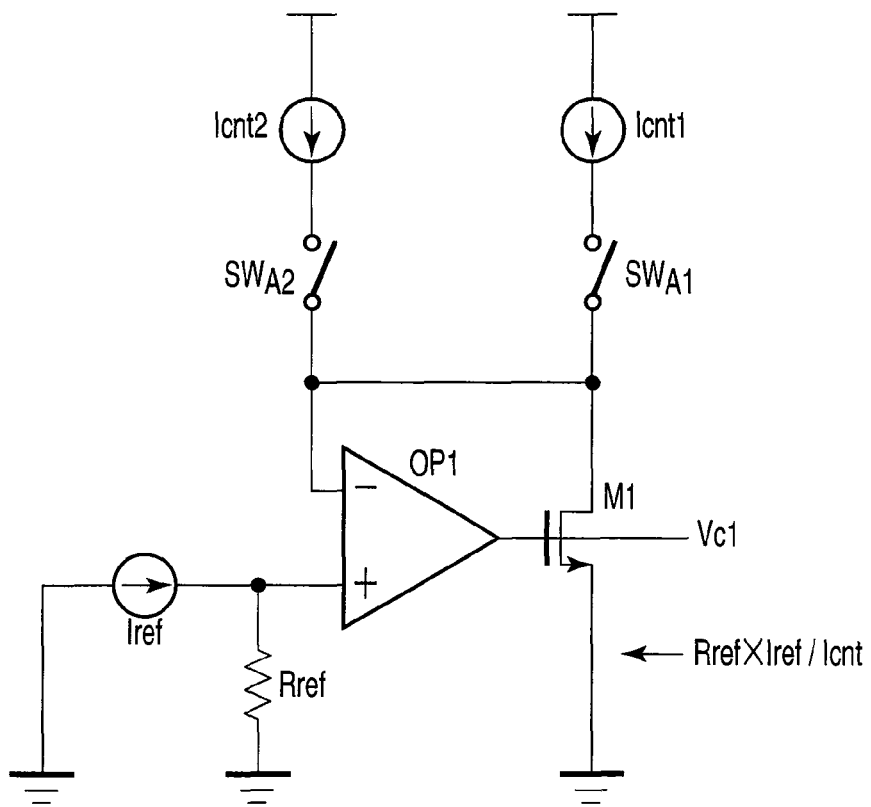
FIG. 14 is a circuit diagram illustrating a process fluctuation-compensated interface.

FIG. 14 illustrates an example of a circuit which compensates such threshold value fluctuation of MOSFETs. The threshold value fluctuation compensating circuit of FIG. 14 is inserted as an interface into one or both of, for example, the input side of the amplitude control signal $V_A$ of the variable attenuator 27 in FIG. 12 and the input side of the phase control signal $V_\theta$ of the variable phase shifter 29 in FIG. 12.

The circuit of FIG. 14 is configured to compensate the threshold value fluctuation of the MOSFET M1 by using a reference voltage $I_{ref} \times R_{ref}$ generated by a reference current Iref and a reference resistor $R_{ref}$ and a control current Icnt ($I_{cnt}1$, $I_{cnt}2$). The control current $I_{cnt}$ indicates the amplitude control signal $V_A$ or the phase control signal $V_\theta$ using a current signal.

When a switch $SW_{A1}$ is turned on, a switch $SW_{A2}$ is turned off, and only the control current $I_{cnt1}$ among the control currents $I_{cnt1}$ and $I_{cnt2}$ prepared with two systems flows through the MOSFET M1 through the switch $SW_{A1}$. The reference voltage $I_{ref} \times R_{ref}$ is supplied to a non-reversal input terminal of the operation amplifier OP1, the output terminal of OP1 is connected to the gate terminal of the MOSFET M1, and the drain terminal of M1 is connected to a reversal input terminal of OP1. By operation of such a feedback system, the drain voltage of the MOSFET M1 is controlled to be equal to the reference voltage $I_{ref} \times R_{ref}$. Therefore, when the threshold voltage $V_{th}$ of the MOSFET M1 increases, the gate-source voltage $V_{GS}$ of M1 automatically increases by the increased amount of $V_{th}$, and the threshold value fluctuation is compensated.

Next, explained is the reason for using the two switches $SW_{A1}$ and $SW_{A2}$ and the two control currents $I_{cnt1}$ and $I_{cnt2}$. According to the second embodiment illustrated in FIG. 12, in the calibration mode and the phase control adjustment mode, the amplitude difference detection signal $V^D_A$ from the amplitude difference detector 35 is supplied to the variable attenuator 27 as the amplitude control signal $V_A$, and in the calibration mode the phase difference detection signal $V^D_\theta$ from the phase difference detector 36 is supplied to the variable phase shifter 29 as the phase control signal $V_\theta$. On the other hand, in the transmission mode, the digital values stored in the memory 44 are output from the controller 40 as the amplitude control signal $V_A$ and the phase control signal $V_\theta$ through the DAC 42, and supplied to the variable attenuator 27 and the variable phase shifter 29.

As described above, in particular, in the second embodiment illustrated in FIG. 12, control signal paths to the variable attenuator 27 and the variable phase shifter 29 are different between the calibration mode and the transmission mode. When the threshold value fluctuation interface of FIG. 14 is used, control signal paths of two systems can be formed for each of the variable attenuator 27 and the variable phase shifter 29.

Although the switches 51 and 52 are provided in FIG. 12, they can be substituted by, for example, the switch $SW_{A1}$ of FIG. 14. On the other hand, turning on/off the $SW_{A2}$ of FIG. 14 corresponds to turning on/off transmission of the amplitude control signal $V_A$ and the phase control signal $V_\theta$ to the variable attenuator 27 and the variable phase shifter 29.

Therefore, in the calibration mode, by turning on the $SW_{A1}$ and turning off the $SW_{A2}$, the variable attenuator 27 is supplied with the amplitude difference detection signal $V^D_A$ as the amplitude control signal $V_A$ from the amplitude difference detector 35, and the variable phase shifter 29 is supplied with the phase difference detection signal $V^D_\theta$ as the phase control signal $V_\theta$ from the phase difference detector 36. On the other hand, in the transmission mode, by turning off $SW_{A1}$ and turning on $SW_{A2}$, the variable attenuator 27 is supplied with the amplitude control signal $V_A$ from the controller 40, and the variable phase shifter 29 is supplied with the phase control signal $V_\theta$ from the controller 40.

(Local Signal Supply Path For Quadrature Demodulator)

Figure 15:
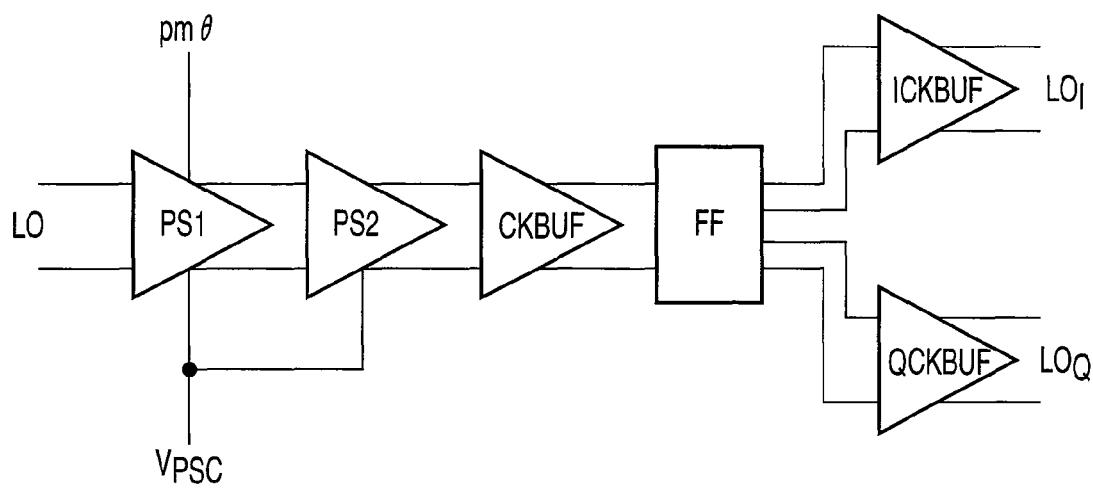
FIG. 15 is a circuit diagram illustrating a local signal supply path for a quadrature demodulator.

As illustrated in FIGS. 1 and 12, the mixers 31 and 32 of the quadrature demodulator 30 are supplied with a local signal from the local oscillator 20 through the variable phase shifter 29 and the 90° phase shifter 33. FIG. 15 illustrates a local signal supply path for the quadrature demodulator 30, and illustrates details of a part corresponding to the variable phase shifter 29 and the 90° phase shifter 33.

In FIG. 15, the local signal LO from the local oscillator 20 is input to phase shifters PS1 and PS2 connected in cascade. The phase shift amount of the phase shifters PS1 and PS2 varies according to the phase control signal $V_{PSC}$. The relation between the phase control signal $V_{PSC}$ and the phase control signal $V_\theta$ of FIG. 1 is described later. The local signal output from the phase shifters PS1 and PS2 is input to a flip-flop FF through a buffer circuit CKBUF. In the flip-flop FF, the input local signal is divided into two local signals with a half of input frequency component, and two local signals having a phase difference of 90° are generated. The two local signals output from the flip-flop FF are supplied to the mixers 31 and 32 in the quadrature demodulator 30, respectively, through an $I_{CH}$ local buffer ICKBUF and a $Q_{CH}$ local buffer QCKBUF, respectively. Since the frequency of the LO signal is reduced to ½ at the output of the flip-flop FF, the local oscillator 20 is required to generate a local signal having a frequency of 2 times as large as the local signal frequency necessary for the quadrature demodulator 30. On the other hand, an RC-CR 90° phase shifter using a differentiator and an integrator may be used instead of the flip-flop FF. In this case, the frequency of the local signal of the 90° phase shifter may be equal between the input and the output thereof.

A polarity switch signal Pmθ is input to the phase shifters PS1. The polarity, that is, the phase of the input local signal can be changed by 180° by the signal Pmθ. As described above, supposing that the flip-flop FF which performs two-frequency division is used as the 90° phase shifter provided after the phase shifters PS1 and PS2, the phases of the local signals supplied to the mixers 31 and 32 can be varied by 90° by 180° phase change of the local signal by the signal Pmθ. Such phase control of the local signal by Pmθ is effective in the case where, for example, the variable range of the phase shifters PS1 and PS2 is reduced by error in the process.

(Specific Example 1 of the Phase Shifters)

Figure 16:
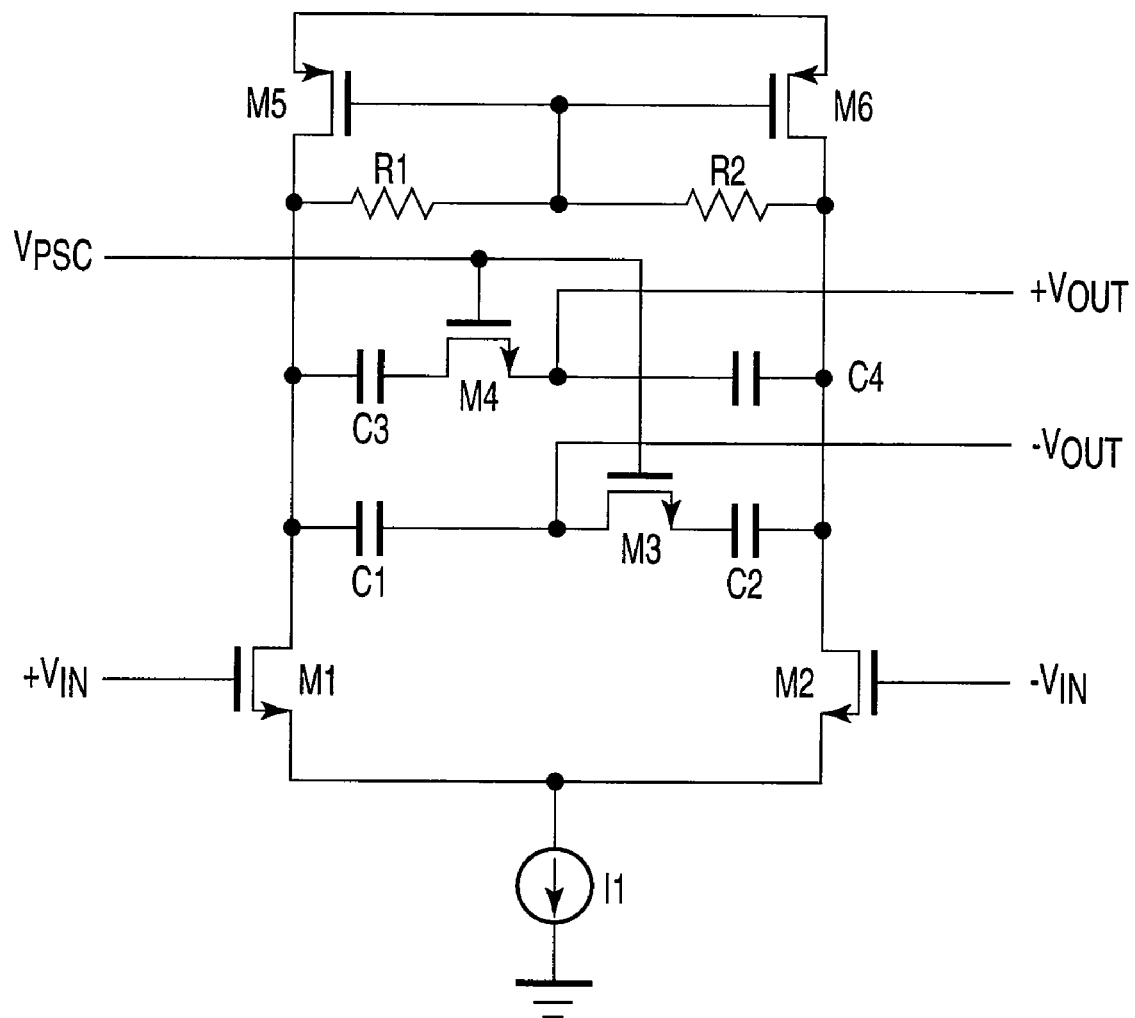
FIG. 16 is a circuit diagram illustrating a specific example of a phase shifter.

FIG. 16 illustrates a specific circuit example of the phase shifters PS1 and PS2 in FIG. 15. The phase shifter of FIG. 16 has MOSFETs M1 to M5 and capacitors C1 to C4. The phase shifter shifts the phase of differential signals input to the input terminals $+V_{IN}$ and $-V_{IN}$, and outputs them from output terminals $+V_{OUT}$ and $-V_{OUT}$. A phase shift circuit is formed by C1, M3, C2, C3, M4, and C4. A drive circuit for the phase shift circuit is formed by a differential pair of M1 and M2, a common source terminal of which is connected with a current source I1, and loads formed of M5, M6, R1, and R2 connected to the drain terminals of M1 and M2.

The MOSFETs M3 and M4 operate as variable resistors, resistance values of which change according to the phase control signal $V_{PSC}$. Since the linear region of MOSFETs is used in variable resistors like attenuators, the drain-source voltage $V_{GS}$ and the threshold voltage $V_{th}$ in M3 and M4 are set to satisfy the relation "$V_{DS}<V_{GS}-V_{th}$". To broaden the control range by the phase control signal $V_{PSC}$, the potentials of the drain terminal of the MOSFET M4 and the source terminal of the MOSFET M3 are close to the power source potential or the GND potential. Therefore, the direct-current potential of the drain terminal of M4 is blocked by the capacitor C3, and the direct-current potential of the source terminal of M3 is blocked by the capacitor C2.

On the other hand, the capacitor C4 forms a CR circuit together with the resistor by the MOSFET M4, and the capacitor C1 forms a CR circuit together with the MOSFET M3. These two CR circuits form a CR bridge circuit. Therefore, when the resistance value of M4 and M3 changes by the phase control signal $V_{PSC}$, the phase of the local signal is changed.

To explain operation of the phase shifter, it is described below how the phase of the output changes in the case where the resistance of the MOSFETs M3 and M4 is large and the case where the resistance is small. When the resistance of M3 and M4 is large, that is, when $V_{PSC}$ is close to $V_{th}$, the drain signal of M2 is transmitted to the terminal $+V_{OUT}$ through C4, since the resistance of M4 is large. Further, since the resistance of M3 is large, the drain signal of M1 is transmitted to the terminal $-V_{OUT}$.

On the other hand, when the resistance of M3 and M4 is small, that is, when $V_{PSC}$ is close to $V_{DD}$, the drain signal of M1 is transmitted to the terminal $+V_{out}$ through C3, since the resistance of M4 is small. Further, since the resistance of M3 is small, the drain signal of M2 is transmitted to the terminal $-V_{OUT}$ through C2. By setting the resistance of M3 and M4 variable, the phase of output signals from the terminals $+V_{OUT}$ and $-V_{OUT}$ change by 180° at the maximum.

The phase characteristic by the CR bridge circuit is represented by the following expression, when the value of the capacitors C1 and C4 is C, and the resistance value (ON resistance) of the MOSFETs M3 and M4 is $R_{ON}$.

$$\theta = 2\tan^{-1}(1/\omega CR_{ON}) \tag{5}$$

θ denotes a phase difference between the voltage between the drain terminals of M2 and M1 and the voltage between the output terminals $+V_{OUT}$ and $-V_{OUT}$. Since M3 and M4 operate in the linear region, $R_{ON}$ can be approximated to "$R_{ON}=A/(V_{PSC}-V_{th})$" as illustrated in FIG. 15, when a proportionality constant is A. Therefore, the expression (5) can be changed as follows.

$$\theta = 2\tan-1\{(V_{PSC}-V_{th})/A\omega C\} \tag{6}$$

Since the MOSFETs are completely turned off when $V_{PSC}$ is smaller than $V_{th}$, the phase θ cannot be controlled by $V_{PSC}$. To prevent it the MOSFETs from being completely turned off, the threshold value compensation circuit can be applied in the same manner as being applied to the attenuator ATT illustrated in FIG. 14. Specifically, when the control currents $I_{cnt1}$ and $I_{cnt2}$ become larger than 1, the output of OP1 is set to M1 to flow the current, that is, the gate potential of M1 is automatically set to a value larger than $V_{th}$. Although the amplitude control signal and the phase control signal are defined by voltage and current in this example, they can be converted according to the expression "V=IR". For example, the control current $I_{cnt1}$ and the $I_{cnt2}$ are equivalent to the phase control signal $V_\theta$.

(Specific Example 2 of the Phase Shifter)

Figure 17:
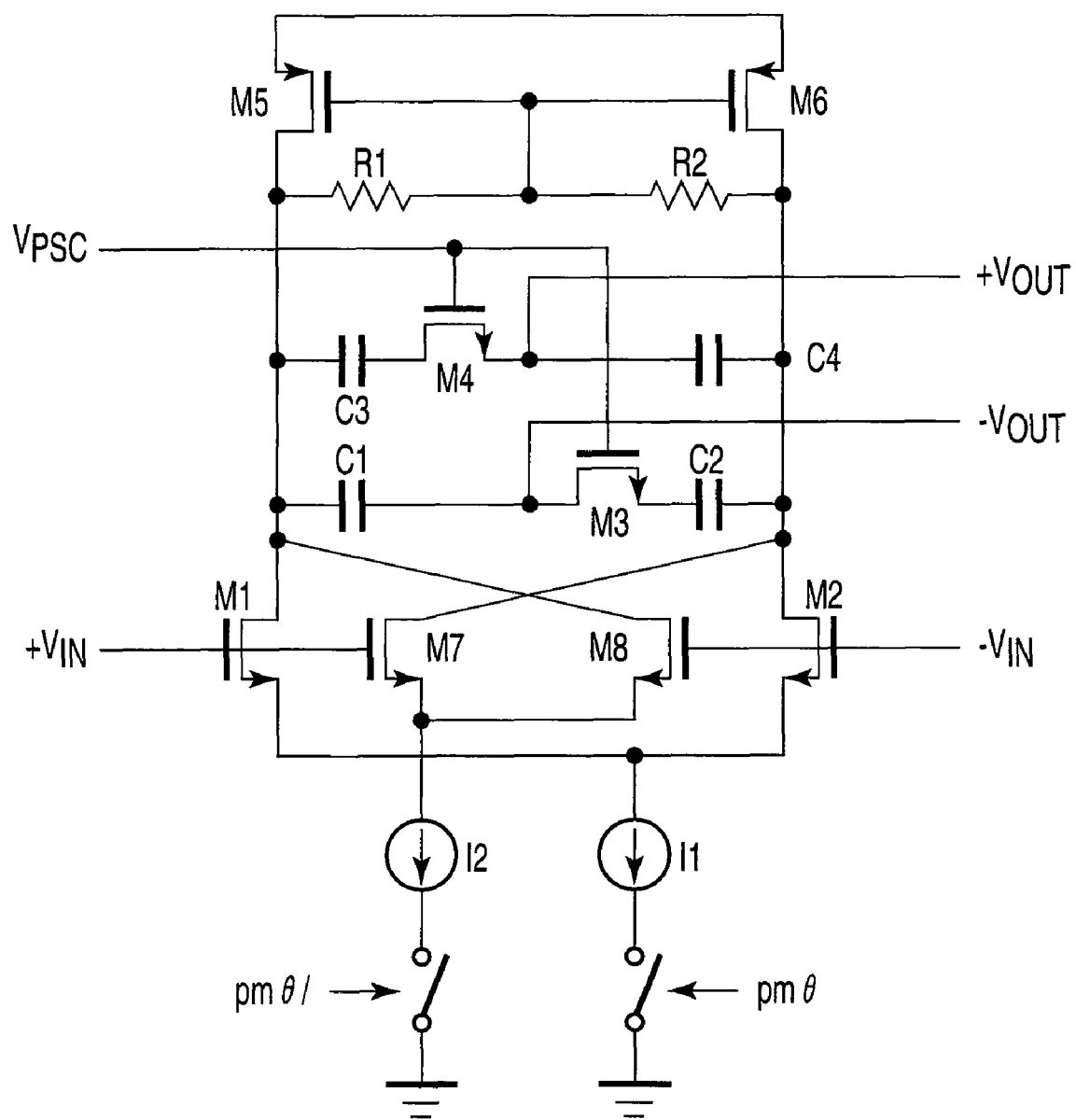
FIG. 17 is a circuit diagram illustrating another specific example of the phase shifter.

FIG. 17 is a circuit diagram obtained by adding the polarity reversal function of the phase shifter PS1 illustrated in FIG. 15 to the phase shifter of FIG. 16. The phase shifter of FIG. 17 has a second differential pair including MOSFETs M7 and M8, in addition to the first differential pair including the MOSFETs M1 and M2 illustrated in FIG. 16. A tail current supplied from a current source $I_1$ to the first differential pair is switched by a polarity switch signal pmθ, and a tail current supplied from a current source $I_2$ to the second differential pair is switched by a reversed polarity switch signal pmθ/.

By the polarity switch signals pmθ and pmθ/, it is determined whether the first differential pair of M1 and M2 operates or the second differential pair of M7 and M8 operates. As illustrated in FIG. 17, gate terminals of M1 and M7 are connected to $+V_{IN}$ in common, and gate terminals of M2 and M8 are connected to $-V_{IN}$ in common. However, drain terminals, which serve as output, of M1 and M8 are connected to each other, and drain terminals of M2 and M7 are connected to each other. Specifically, connection of drain terminals being output are reversely connected between the first differential pair and the second differential pair. Therefore, the first differential pair and the second differential pair are selectively operated by the polarity switch signals pmθ and pmθ/, and thereby the polarity of the output signal of the phase shifter can be reversed.

(Amplitude/Phase Detection Circuits)

Figure 18:
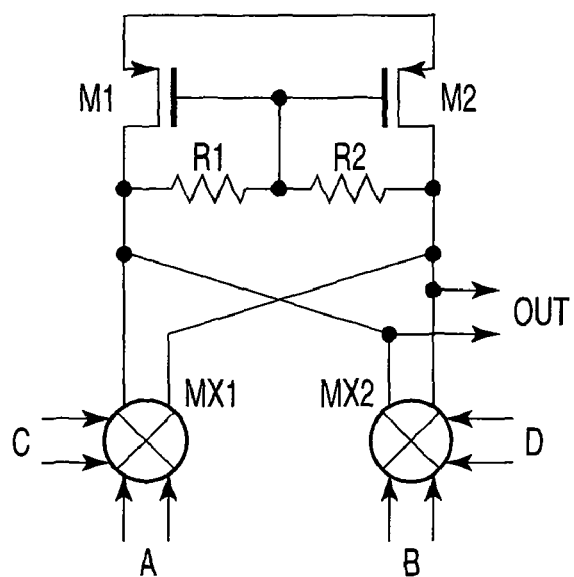
FIG. 18 is a circuit diagram illustrating an amplitude/phase detection circuit.

Next, explained is a specific example of the amplitude difference detector 35 and the phase difference detector 36 in FIGS. 1 and 12. When the amplitude difference detector 35 and the phase difference detector 36 are achieved by an analogue circuit, for example, an amplitude/phase detecting circuit as illustrated in FIG. 18 can be used. FIG. 18 illustrates a circuit that receives inputs A, B, C and D, an amplitude or a phase of which is to be detected, and obtains a detection output OUT.

Amplitude difference detection is performed according to the expression (1), for example, as described above. The part $(mI_{CH}^2+mQ_{CH}^2)$ in the expression (1) indicates an output OUT (referred to as OUT1) when the inputs A and C represent $mI_{CH}$, and $mQ_{CH}$ is input to B and D. In the same manner, $(I_{CH}^2+Q_{CH}^2)$ in the expression (1) indicates an output OUT (referred to as OUT2) when the inputs A and C represent $I_{CH}$, and $Q_{CH}$ is input to B and D. Detection of the amplitude difference ΔA according to the expression (1) can be achieved by an analogue circuit, by detecting a difference corresponding to OUT1-OUT2.

Figure 19:
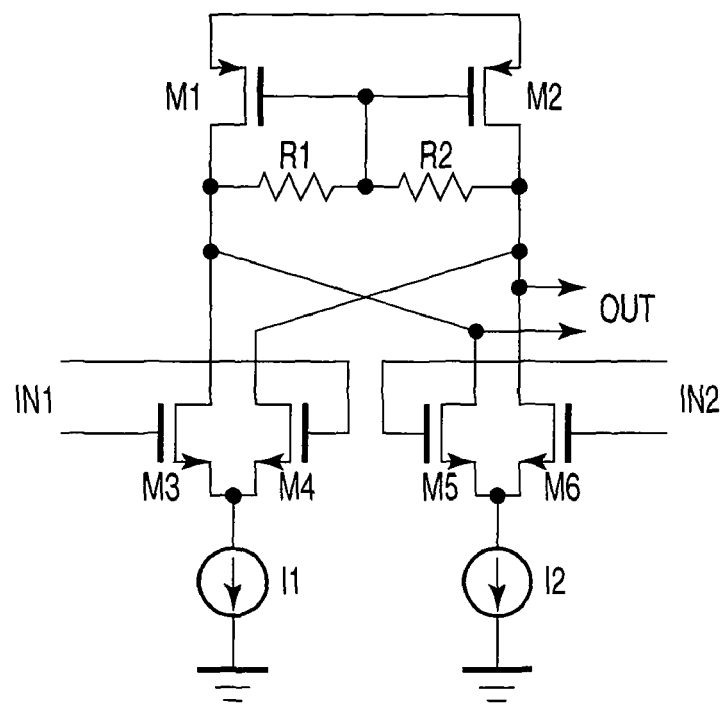
FIG. 19 is a circuit diagram of a difference detection circuit.

FIG. 19 illustrates an example of a difference detection circuit which detects "OUT1-OUT2". OUT1 is provided as an input IN1, and OUT2 is provided as an input IN2. The difference detection circuit of FIG. 19 has a first differential amplifier formed of a differential pair of MOSFETs M3 and M4 and a common current source $I_1$, a second differential amplifier formed of a differential pair of MOSFETs M5 and M6 and a common current source $I_2$, and a load circuit which is shared by the first and second differential amplifiers and has MOSFETs M1 and M2 and resistors R1 and R2. The input of the first differential amplifier is IN1, and the input of the second differential amplifier is IN2.

Outputs of the first differential amplifier and the second differential amplifier are connected to the shared load circuit, with the polarities thereof reversed. The differential detection circuit of FIG. 19 obtains a signal corresponding to IN1-IN2, that is, OUT1-OUT2 at the output OUT. Therefore, the amplitude difference detector 35 can be realized by combining the circuit of FIG. 19 with the circuit of FIG. 18.

Since phase difference detection is performed by using the expressions (2) and (3) as described above, phase difference detection can be achieved by the circuit of FIG. 18. Specifically, calculation of the expression (2) can be achieved by inputting $I_{CH}$ to input A, $mI_{CH}$ to input C, $Q_{CH}$ to input B, and $mQ_{CH}$ to input D. Further, calculation of the expression (3) can be achieved by inputting $I_{CH}$ to input A, $mQ_{CH}$ to input C, $-Q_{CH}$ to input B, and $mI_{CH}$ to input D. The phase difference Δθ is determined by using the values of cos Δθ and sin Δθ determined by the expressions (2) and (3), and thereby the phase control signal $V_θ$ can be obtained.

To obtain the necessary amplitude control signal $V_A$ and the phase control signal $V_θ$ by performing feedback by using an analogue circuit, feedback may be performed by using the voltage signals without any change. However, feedback may be performed after converting the voltage signals into current signals. When feedback is performed after the voltage signals are converted into current signals, it is desirable to use the threshold fluctuation compensating circuit illustrated in FIG. 14.

(Polarity Reversal Switch and Baseband Amplifier)

Figure 20:
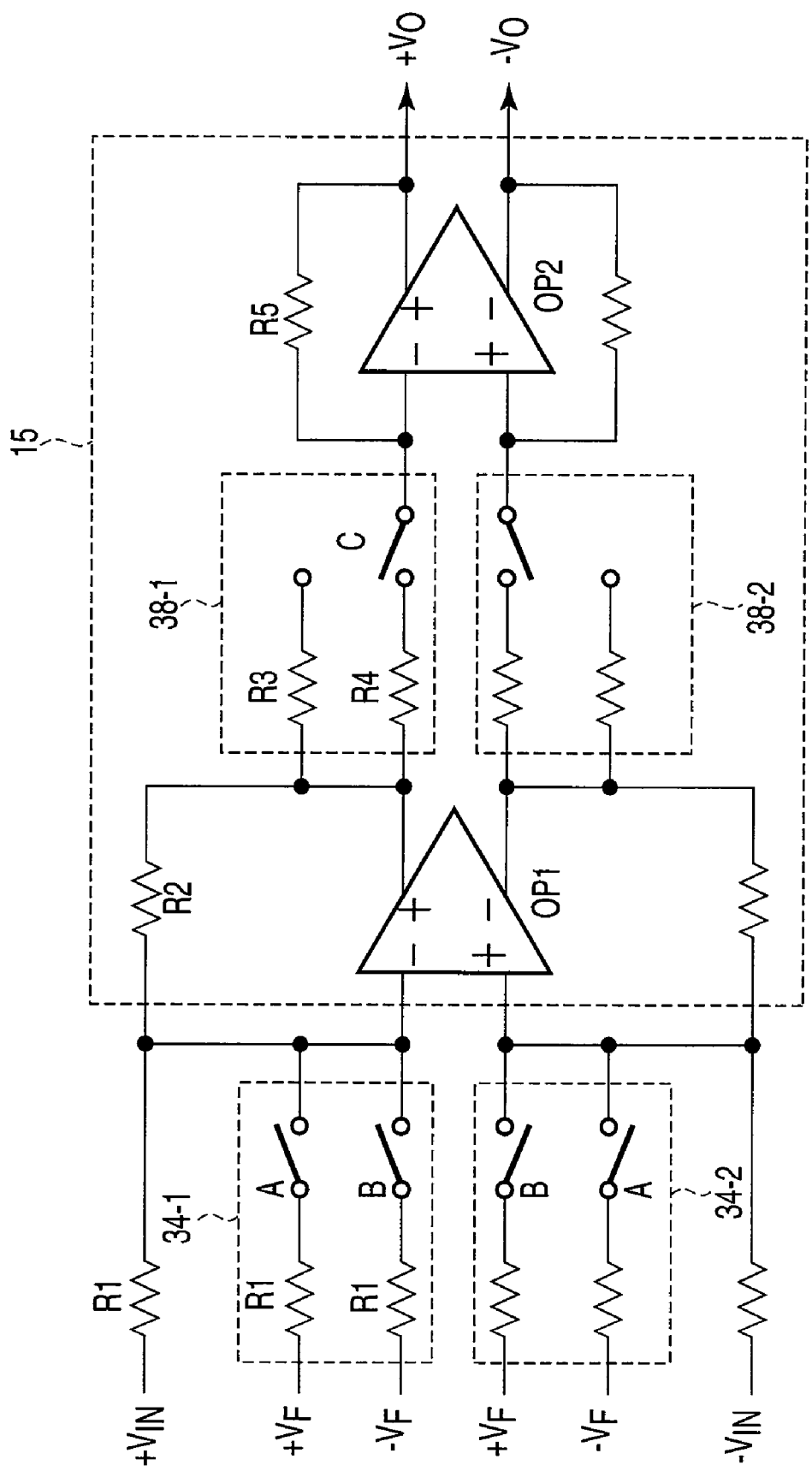
FIG. 20 is a circuit diagram illustrating a specific example of a polarity reversal switch and a baseband amplifier.

FIG. 20 illustrates a specific circuit example of the switch 34 and the baseband amplifier 15 illustrated in FIGS. 1 and 12. In FIG. 20, the switch 34 is illustrated with two divided blocks 34-1 and 34-2. Reference symbol $V_{IN}$ represents input I/Q signals $I_{CH}$ or $Q_{CH}$, and feedback signal $V_F$ corresponds to the feedback I/Q signals $mI_{CH}$ or $mQ_{CH}$. By turning on one of the switches A and B and turning off the other switch, the feedback I/Q signals ($V_F$) are input with the polarities thereof changed. On the other hand, since it is unnecessary to change the polarities of the input I/Q signals $V_{IN}$, they are input without any change. The gain is provided by $-R2/R1$.

The baseband amplifier 15 is configured to change the gain between the calibration mode, in which the Cartesian loop is opened, and when the Cartesian loop is closed. The baseband amplifier 15 has two stages of operation amplifiers, OP1 and OP2, which are connected in cascade, and gain switch circuits 38-1 and 38-2 which are inserted between OP1 and OP2. The gain of the second operation amplifier OP2 including feedback resistors is represented by $-R5/R3$ or $-R5/R4$. In this example, the gain switch circuits 38-1 and 38-2 can change the gain in two stages by selecting the two resistors R3 and R4 by switch C.

For example, suppose that "R3=10×R4=R5" is satisfied, R3 is selected in the calibration mode, and R4 is selected in the transmission mode. In the calibration mode, the baseband amplifier 15 functions as the amplifier of "gain–R5/R3=−1". In this state, the feedback V-ATT is set such that the loop gain is 1. When the transmitter proceeds to the transmission mode from the calibration mode, the resistor R3 is switched to R4. Therefore, the gain becomes "−R5/R4=−10", and increases by 20 dB from the gain in the calibration mode. Specifically, the loop gain becomes 20 dB in the transmission mode, and thus the linearity is increased.

Since one of the resistors R3 and R4 is selected by the switch C in the gain switch circuits 38-1 and 38-2 in FIG. 20, transient response occurs in switching the gain. When the transient response time is limited when the transmitter adopts a wireless mode, it is required to successively change the gain, not rapidly change the gain.

Figure 21:
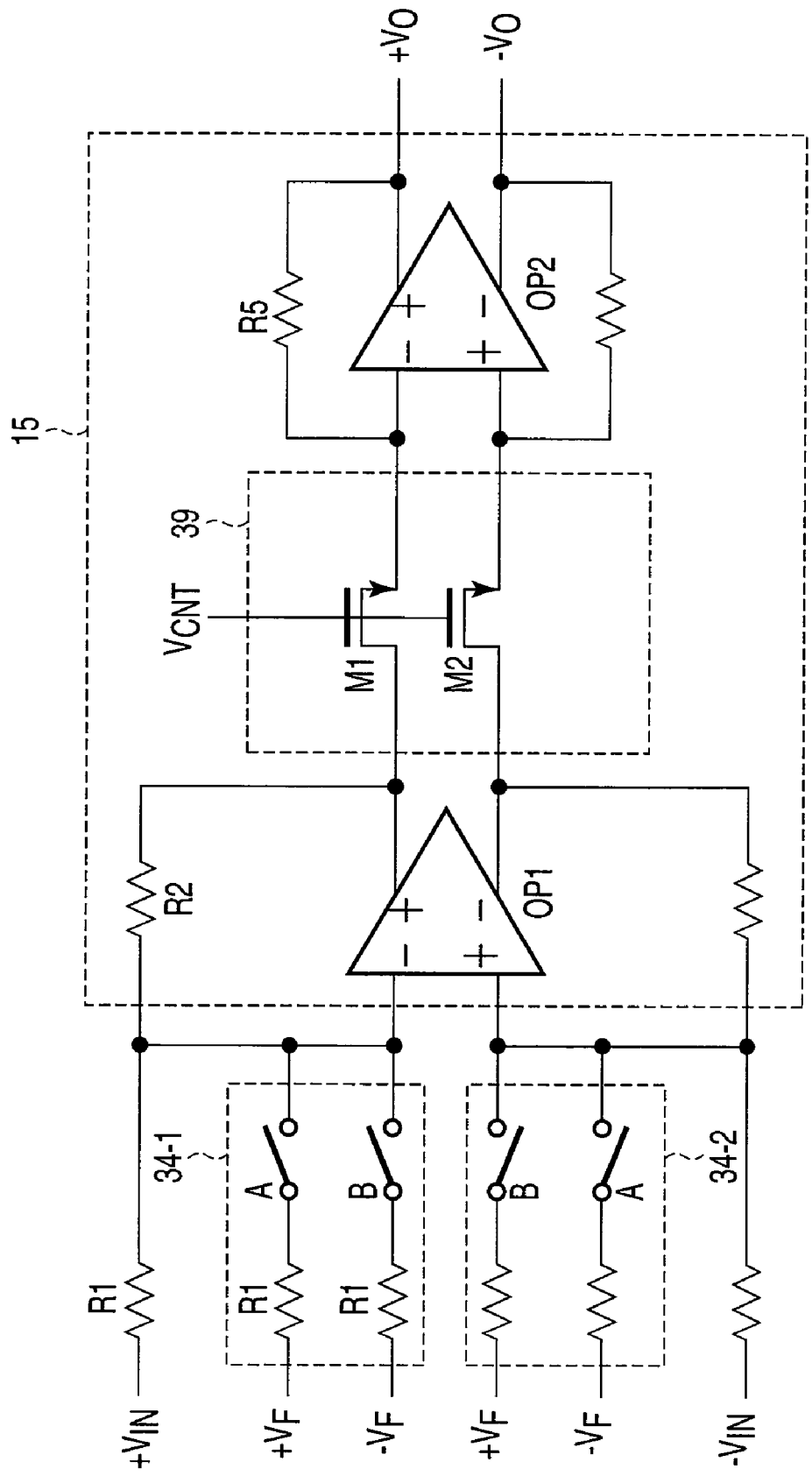
FIG. 21 is a circuit diagram illustrating another specific example of the polarity reversal switch and the baseband amplifier.

In a baseband amplifier 15 illustrated in FIG. 21, the gain switch circuits 38-1 and 38-2 in FIG. 20 are substituted by a variable resistor circuit 39 formed of MOSFETs M1 and M2. Gate terminals of M1 and M2 are supplied with a gain control voltage $V_{CNT}$, which corresponds to a gain setting signal, from the controller 40. The gain of the baseband amplifier 15 is successively changed by change in the resistance of the MOSFETs M1 and M2 by the gain control voltage $V_{CNT}$. In the calibration mode, the resistance value of M1 and M2 is set to have the same value as that of R5. When the transmitter is changed from the calibration mode to the transmission mode, the gain control voltage $V_{CNT}$ is set such that the resistance value of M1 and M2 gently changes from R5 to about R5/10. This eliminates rapid gain change of the baseband amplifier 15, and thus the time necessary for the gain to converge to a predetermined value may be shortened.

(I/Q Imbalance Compensation)

When the quadrature modulator and the quadrature demodulator are realized by an analogue circuit, there occurs an amplitude error and a phase error between the I component (in-phase component) and the Q component (quadrature component), due to imperfection of the analogue circuit. Such an error of amplitude and phase between I-Q components is generally called I/Q imbalance. The Cartesian loop can also be applied to compensation of I/Q imbalance.

The above embodiments show examples in which distortion occurring in the transmission section is compensated by using the linearity of the feedback path of the Cartesian loop. In the same manner, when I/Q imbalance of the quadrature demodulator 30 in the feedback path is small, I/Q imbalance of the quadrature modulator 16 of the transmission system can also be compensated by using the Cartesian loop. Specifically, an I/Q imbalance compensation technique for a quadrature demodulator, which is performed in radio receivers in prior art, is applied to the quadrature demodulator 30 in the Cartesian loop. Further, when I/Q imbalance is caused by a phase error of the 90° phase shifter 33 for local signals, adjustment is performed such that the phase difference between two local signals output from the 90° phase shifter 33 is 90°. In principle, the adjustment applies to only the quadrature demodulator of the feedback path if loop gain is high enough to compensate errors in the forward path. This adjustment of phase difference may be performed by using, for example, the phase shifter of FIG. 16. As described above, it is possible to correct the error of the transmission system by the Cartesian loop, by realizing accurate quadrature demodulator 30 in the feedback path of the Cartesian loop.

Although the local oscillator 20 is shared between the quadrature modulator 16 and the quadrature demodulator 30 in the above embodiments as illustrated in FIG. 1, the local oscillator 20 does not have to be shared, and two local oscillators (not shown) may be used.

Further, the resistor R is provided to prevent radiation of signals from the antenna 25 in the state where the Cartesian loop is closed. On the other hand, the antenna switch 26 and the resistor R may not be provided in some cases, such as the case where signals may be radiated from the antenna 25.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio transmitter using a Cartesian loop comprising:
    a combiner which combines input I/Q signals to be transmitted with feedback I/Q signals to generate combined I/Q signals;
    a quadrature modulator which performs quadrature modulation on the combined I/Q signals to generate a quadrature modulated signal;
    a power amplifier which amplifies the quadrature modulated signal to output a transmission RF signal;
    a quadrature demodulator which performs quadrature demodulation, by using a local signal, on a feedback RF signal branched from the transmit RF signal to generate the feedback I/Q signals;
    a detector which detects each amplitude difference and each phase difference between the input I/Q signals and the feedback I/Q signals;
    a switch to turn on and off input of the feedback I/Q signals to the combiner;
    a power setting unit which sets transmission power of the transmit RF signal;
    a control signal generator to generate at least one amplitude control signal which minimizes the amplitude difference and at least one phase control signal which minimizes the phase difference, in a state where the transmission power is set, during for a period during which the switch is turned off;
    a memory which stores the amplitude control signal and the phase control signal;
    an amplitude adjuster which adjusts an amplitude of the feedback RF signal in accordance with the amplitude control signal stored in the memory, during for a period during which the switch is turned on;
    a phase adjuster which adjusts a phase of the local signal in accordance with the phase control signal stored in the memory, during for the period during which the switch is turned on; and
    a gain setting unit which sets a first loop gain for the Cartesian loop when the switch is turned off, and sets a second loop gain higher than the first loop gain for the Cartesian loop when the switch is changed from an off state to an on state.

2. A radio transmitter according to claim 1, further comprising:
    a variable-gain baseband amplifier which is provided in a stage before the quadrature modulator and amplifies the combined I/Q signals,
    wherein the gain setting unit is configured to set the first gain at the baseband amplifier when the switch is turned off, and set the second gain higher than the first gain at the baseband amplifier when the switch is changed from the off state to the on state.

3. A radio transmitter according to claim 1, wherein the phase adjuster is controlled to adjust the phase of the local signal after the amplitude adjuster adjusts the amplitude of the feedback RF signal.

4. A radio transmitter according to claim 1, wherein the amplitude adjuster includes a variable attenuator, an attenuation amount of which is controlled in accordance with the amplitude control signal.

5. A radio transmitter according to claim 1, wherein the phase adjuster includes a variable phase shifter, a phase shift amount of which is controlled in accordance with the phase control signal.

6. A radio transmitter according to claim 1, further comprising:
    a termination unit which terminates an output terminal of the power amplifier to a reference potential point, in a period during which the switch is turned off.

7. A radio transmitter according to claim 1, wherein the control signal generator includes a calculator, which calculates an amplitude difference detection signal indicating the amplitude difference at a time when the amplitude of the feedback RF signal is adjusted by an amplitude calibration control signal that monotonously increases or monotonously decreases, and is configured to generate the amplitude calibration control signal at a time when the amplitude difference detection signal is changed from positive to negative or negative to positive, as the amplitude control signal.

8. A radio transmitter according to claim 7, wherein the calculator is configured to calculate the amplitude difference detection signal, by multiplying a constant by a difference between the magnitude of a vector of the input I/Q signals and the magnitude of a vector of the feedback I/Q signals.

9. A radio transmitter according to claim 1, wherein single tone signals are used as the input I/Q signals when the control signal generator generates the amplitude control signal.

10. A radio transmitter according to claim 1, wherein the control signal generator includes a detector which detects the phase difference when a phase of the feedback RF signal is adjusted by a phase calibration control signal that monotonously increases or monotonously decreases, and is configured to generate the phase calibration control signal for the time when the phase difference is almost 90°, as the phase control signal.

11. A radio transmitter according to claim 1, wherein the control signal generator includes a difference calculator, which calculates a difference between product of an I component element of the vector of the input I/Q signals and a Q component element of the vector of the feedback I/Q signals and product of a Q component element of the vector of the input I/Q signals and an I component element of the vector of the feedback I/Q signals when a phase of the feedback RF signal is adjusted by a phase calibration control signal that monotonously increases or monotonously decreases, and the control signal generator is configured to generate the phase calibration control signal when a sign of the difference changes from positive to negative or from negative to positive, as the phase control signal.

12. A radio transmitter according to claim 11, wherein the control signal generator further includes a sum calculator, which calculates a sum of product of the I component element of the vector of the input I/Q signals and the I component element of the vector of the feedback I/Q signals and product of the Q component element of the vector of the input I/Q signals and the Q component element of the vector of the feedback I/Q signals when the phase of the feedback RF signal is adjusted by the phase calibration control signal, and the control signal generator is configured to store information indicating reversing polarity of the feedback I/Q signals when a sign of the sum is negative.

13. A radio transmitter according to claim 1, wherein the control signal generator includes a calculator which calculates the amplitude difference detection signal indicating the amplitude difference, by multiplying a constant by a difference between the square or square root of the magnitude of a vector of the input I/Q signals and the square or square root of the magnitude of a vector of the feedback I/Q signals, and is configured to generate the amplitude difference detection signal as the amplitude control signal after a predetermined time has passed since the switch is turned off, and
the amplitude adjuster is configured to adjust the amplitude of the feedback I/Q signals in accordance with the amplitude difference detection signal, in the period in which the switch is turned off.

14. A radio transmitter according to claim 1, wherein the control signal generator includes a difference calculator, which calculates a phase difference detection signal indicating the phase difference, by multiplying a constant by a difference between a first product of an I component element of the vector of the input I/Q signals and a Q component element of the vector of the feedback I/Q signals and a second product of a Q component element of the vector of the input I/Q signals and an I component element of the vector of the feedback I/Q signals, and the control signal generator is configured to generate the phase difference detection signal as the phase control signal after a predetermined time has passed since the switch is turned off, and the phase adjuster is configured to adjust the phase of the local signal in accordance with the phase difference detection signal, in the period during which the switch is turned off.

15. A radio transmitter according to claim 14, wherein the control signal generator further includes a sum calculator, which calculates a sum of a third product of the I component element of the vector of the input I/Q signals and the I component element of the vector of the feedback I/Q signals and a fourth product of the Q component element of the vector of the input I/Q signals and the Q component element of the vector of the feedback I/Q signals when the phase of the feedback RF signal is adjusted by the phase calibration control signal, and the control signal generator is configured to store information indicating reversing polarity of the feedback I/Q signals when a sign of the sum is negative.

16. A radio transmitter according to claim 1, further comprising:
an interface which is provided on an input side of the amplitude control signal of the amplitude adjuster, and selectively transmits the amplitude control signal generated by the control signal generator and the amplitude control signal stored in the memory.

17. A radio transmitter according to claim 16, wherein the amplitude adjuster includes a MOSFET, and the interface is configured to compensate threshold value fluctuation of the MOSFET.

18. A radio transmitter according to claim 1, further comprising:
an interface which is provided on an input side of the phase control signal of the phase adjuster, and selectively transmits the phase control signal generated by the control signal generator and the phase control signal stored in the memory.

19. A radio transmitter according to claim 18, wherein the phase adjuster includes a MOSFET, and the interface is configured to compensate threshold value fluctuation of the MOSFET.

20. A radio transmitter according to claim 1, wherein the phase adjuster includes:
a first MOSFET which has a first gate terminal, a first source terminal, and a second drain terminal, the first gate terminal being connected to a first input terminal;
a second MOSFET which has a second gate terminal, a second source terminal, and a second drain terminal, the second gate terminal being connected to a second input terminal;
a current source connected to the first source terminal and the second source terminal in common;
a third MOSFET which has a third gate terminal connected to a control terminal receiving the phase control signal, a third drain terminal connected to a first output terminal, and a third source terminal;
a fourth MOSFET which has a fourth gate terminal connected to the control terminal, a fourth drain terminal, and a fourth source terminal connected to a second output terminal;
a first capacitor connected between the first drain terminal and the third drain terminal;
a second capacitor connected between the third source terminal and the second drain terminal;
a third capacitor connected between the first drain terminal and the fourth drain terminal; and
a fourth capacitor connected between the fourth source terminal and the second drain terminal.

21. A method of controlling a Cartesian loop formed to feed back feedback I/Q signals, which are obtained by demodulating a feedback RF signal branched from a transmit RF signal by using a local signal, comprising:
    setting the transmission power of the transmit RF signal;
    setting a first loop gain for the Cartesian loop when the Cartesian loop is opened;
    generating an amplitude control signal which minimizes each amplitude difference between input I/Q signals to be transmitted under a state where the transmission power is set and the feedback I/Q signals, during for a period during which the Cartesian loop is opened;
    generating a phase control signal which minimizes each phase difference between the input I/Q signals and the feedback I/Q signals;
    storing the amplitude control signal and the phase control signal;
    setting a second loop gain higher than the first loop gain for the Cartesian loop when the Cartesian loop changes from an opened state to a closed state;
    adjusting an amplitude of the feedback RF signal in accordance with the stored amplitude control signal, in a period during which the Cartesian loop is closed; and
    adjusting a phase of the local signal in accordance with the stored phase control signal, in the period during which the Cartesian loop is closed.

\* \* \* \* \*